(12) United States Patent
Schlom et al.

(10) Patent No.: US 11,996,129 B2
(45) Date of Patent: May 28, 2024

(54) SEMICONDUCTOR CIRCUITS AND DEVICES BASED ON LOW-ENERGY CONSUMPTION SEMICONDUCTOR STRUCTURES EXHIBITING MULTI-VALUED MAGNETOELECTRIC SPIN HALL EFFECT

(71) Applicants: Cornell University, Ithaca, NY (US); The Curators of the University of Missouri, Lees Summit, MO (US); The Regents of the University of Michigan, Ann Arbor, MI (US); Oregon State University, Corvallis, OR (US); Mostafizur Rahman, Kansas City, MO (US); Kelin Kuhn, Corvallis, OR (US); John Heron, Saline, MI (US)

(72) Inventors: Darrell Schlom, Ithaca, NY (US); Mostafizur Rahman, Kansas City, MO (US); Kelin Kuhn, Corvallis, MO (US); John Heron, Saline, MO (US)

(73) Assignees: Cornell University, Ithaca, NY (US); The Curators of the University of Missouri, Columbia, MO (US); The Regents of the University of Michigan, Ann Arbor, MI (US); Oregon State University, Corvallis, OR (US)

( * ) Notice: Subject to any disclaimer, the term of this patent is extended or adjusted under 35 U.S.C. 154(b) by 206 days.

(21) Appl. No.: 16/308,337

(22) PCT Filed: Jun. 12, 2017

(86) PCT No.: PCT/US2017/037051
§ 371 (c)(1),
(2) Date: Dec. 7, 2018

(87) PCT Pub. No.: WO2017/214628
PCT Pub. Date: Dec. 14, 2017

(65) Prior Publication Data
US 2023/0186961 A1    Jun. 15, 2023

Related U.S. Application Data

(60) Provisional application No. 62/348,803, filed on Jun. 10, 2016.

(51) Int. Cl.
*G11C 16/04*    (2006.01)
*G11C 11/16*    (2006.01)
(Continued)

(52) U.S. Cl.
CPC ........ *G11C 11/161* (2013.01); *G11C 11/1673* (2013.01); *G11C 11/1675* (2013.01);
(Continued)

(58) Field of Classification Search
CPC .............. G11C 11/161; G11C 11/1673; G11C 11/1675; G11C 11/18; G11C 11/5607
See application file for complete search history.

(56) References Cited

U.S. PATENT DOCUMENTS 9,230,626 B2 *   1/2016   Buhrman .............. G11C 11/161
9,269,415 B1 *   2/2016   Liu ........................ H10N 50/10
(Continued)

OTHER PUBLICATIONS

PCT/US2022/070426 International Search Report and Written Opinion dated Apr. 5, 2022, 8 pages.
(Continued)

*Primary Examiner* — Pho M Luu
(74) *Attorney, Agent, or Firm* — COZEN O'CONNOR

(57) ABSTRACT

A semiconductor device includes ferromagnetic, magnetostrictive layer that exhibits a biaxial magnetic anisotropy and an underlying structure exhibits a spin Hall effect to provide a conversion between electrical energy and magnetic energy with more than two distinctive magnetic states, wherein the
(Continued)

underlying structure includes a piezoelectric material structure and a spin Hall metal layer.

19 Claims, 20 Drawing Sheets

(51) Int. Cl.
    *G11C 11/18*         (2006.01)
    *G11C 11/56*         (2006.01)
    *H10N 52/85*        (2023.01)

(52) U.S. Cl.
    CPC .......... *G11C 11/18* (2013.01); *G11C 11/5607* (2013.01); *H10N 52/85* (2023.02)

(56) References Cited

U.S. PATENT DOCUMENTS

| | | | |
|---|---|---|---|
| 10,333,058 | B2* | 6/2019 | Aradhya ................. G11C 11/18 |
| 2008/0193034 | A1 | 8/2008 | Wang |
| 2013/0039559 | A1 | 2/2013 | Grass et al. |
| 2016/0341539 | A1 | 11/2016 | Adie et al. |
| 2017/0241765 | A1 | 8/2017 | Adie et al. |
| 2021/0003382 | A1 | 1/2021 | Adie et al. |

OTHER PUBLICATIONS

Kent, A.D. et al. "A new spin on magnetic memories" Nature Nanotechnology, vol. 10, Mar. 2015, pp. 187-191.
Schlom, D.G. et al. "A Thin Film Approach to Engineering Functionality into Oxides" J. Am. Ceram. Soc., Aug. 2008, vol. 91; No. 8, pp. 2429-2454.
Soukiassian A. et al. "Acoustic Bragg mirrors and cavities made using piezoelectric oxides" Applied Physics Letters 90, Jan. 2007, pp. 042909-1-042909-3.
Ihlefeld, J.F. et al. "Adsorption-controlled molecular-beam epitaxial growth of Bi Fe O 3" Applied Physics Letters 91, Aug. 2007, pp. 071922-1-071922-3.
Nikonov, D.E. et al. "Benchmarking of Beyond-CMOS Exploratory Devices for Logic Integrated Circuits" IEEE Journal on Exploratory Solid-State Computational Devices and Circuits, published Apr. 2, 2015, pp. 3-11.
Vaithyanathan, V., et al. "c-axis oriented epitaxial films on (001) Si" Jul. 2006 Journal of Applied Physics 100(2), pp. 024108-1-024108-9.
Miron, I.M. et al. "Current-driven spin torque induced by the Rashba effect in a ferromagnetic metal layer" Nature Materials, vol. 9, Mar. 2010, pp. 230-234.
Heron, J.T. et al. "Deterministic switching of ferromagnetism at room temperature using an electric field", Nature, vol. 16, Dec. 2014, 15 pages.
Chu, Y-H et al. "Electric-field control of local ferromagnetism using a magnetoelectric multiferroic" Nature Materials, vol. 7, Jun. 2008, pp. 478-482.
Mannhart, J. et al. "Electric Field Effect in High-Tc Superconductors" Journal of Alloys and Compounds, vol. 195 May 1993, pp. 519-526.

Yu, C. et al. Ferromagnetic resonance in ferromagnetic/ferroelectric Fe/Ba Ti O3/ SrTi O 3 (001), Journal of Applied Physics vol. 103, Feb. 2008.
Baek, S.H. et al. "Giant Piezoelectricity on Si for Hyperactive MEMS" Science vol. 334, Nov. 18, 2011, pp. 958-961.
Chang, W. et al. "In-plane anisotropy in the microwave dielectric properties of SrTiO 3 films" Journal of Applied Physics, vol. 98, Jul. 2005, pp. 124107-7-124107-7.
Li, Y.L. et al. "Interfacial coherency and ferroelectricity of Ba Ti O 3/Sr Ti O 3 superlattice films" Applied Physics Letters , vol. 91, Sep. 2007, pp. 252904-1-252904-3.
Irvin, P. et al. "Localized microwave resonances in strained SrTiO3 thin films" Applied Physics Letters, vol. 88, Jan. 2006, pp. 042902-1-042902-3.
Vasudevarao, A. et al. "Multiferroic Domain Dynamics in Strained Strontium Titanate" Physical Review Letters, vol. 97, Dec. 2006, pp. 257602-1-257602-4.
Chu, Y-H. et al. "Nanoscale Domain Control in Multiferroic BiFeO3 Thin Films Advanced Materials" vol. 18, Sep. 2006, pp. 2307-2311.
Zhao, H.J. et al. "Near room-temperature multiferroic materials with tunable ferromagnetic and electrical properties" Nature Communications, May 2014, 7 pages.
Zhang, J.X et al. "Phase-field model for epitaxial ferroelectric and magnetic nanocomposite thin films" Applied Physics Letters, vol. 90, Jan. 31, 2007, pp. 052909-052909-3.
Vasudevarao, A. et al. "Polarization rotation transitions in anisotropically strained SrTiO3 thin films" Applied Physics Letters, vol. 92, May 2008, pp. 192902-1-192902-3.
Li, Y.L. et al. "Prediction of ferroelectricity in Ba Ti O 3/Sr Ti O 3 superlattices with domains" Applied Physics Letters, vol. 91, Sep. 2007, pp. 112914-1-112914-3.
Tenne, D.A. et al. "Probing Nanoscale Ferroelectricity by Ultraviolet Raman Spectroscopy" Science 313, 1614 (2006), 22 pages.
Tenne, D.A. et al. "Raman study of oxygen reduced and re-oxidized strontium titanate" Physical Review B 76, Jul. 2007, pp. 024303-1-024303-7.
Biegalski, M.D. et al. "Relaxor ferroelectricity in strained epitaxial SrTiO3 thin films on DyScO3 substrates" Applied Physics Letter, vol. 88, May 2006, pp. 192907-1-192907-3.
Manipatruni, S. et al. "Spin-Orbit Logic with Magnetoelectric Switching: A Multi-Generation Scalable Charge Mediated Nonvolatile Spintronic Logic" arXiv 1512.05428 (2015) 60 pages.
Liu, L. et al. "Spin-Torque Switching with the Giant Spin Hall Effect of Tantalum" Science, vol. 336, May 4, 2022, pp. 555-558.
Schlom, D.G. et al. "Strain Tuning of Ferroelectric Thin Films" Annual Review of Materials Research, May 2007, vol. 37, pp. 589-626.
Venimadhav, A. et al. "Structural and transport properties of epitaxial thin films" Applied Physics Letters, vol. 87, Oct. 2005, pp. 172104-1-172104-3.
Tian, W. et al. "Structural evidence for enhanced polarization in a commensurate short- period BaTiO3 /SrTiO3 superlattice" Applied Physics Letters, vol. 89, Aug. 2006, pp. 092905-1-092905-3.
Multiferroics "Towards a magnetoelectric memory" Nature Materials | vol. 7, Jun. 2008, pp. 425-426.
Khasanvis, S. et al. "Wave-based Multi-valued Computation Framework" Jul. 2014 IEEE/ACM International Symposium on Nanoscale Architectures (NANOARCH), pp. 171-176.

* cited by examiner

| Write operation (Voltage for magnetoelectric, current for spin Hall bias) | Magnetization direction | Readout (Inverse spin Hall) current |
|---|---|---|
| V- I+, V+ I+ | ← | 3I |
| V+ I+, V- I+ | ↓ | I |
| V+ I+, V- I- | ↑ | -I |
| V- I+, V+ I- | → | -3I |

FIG. 3

| Adder Bit-Width | Area (μm²) | | Delay (ps) | | Power (μW) | |
|---|---|---|---|---|---|---|
| | CMOS | WC | CMOS | WC | CMOS | WC |
| 4-bit | 430 | | 550 | 225 | 3200 | 5 |
| 8-bit | 850 | 14 | 750 | 315 | 7300 | 9 |
| 16-bit | 1700 | 27 | 1400 | 515 | 14600 | 17 |
| 32-bit | 3410 | 54 | 2800 | 915 | 29200 | 33 |

Parameters: [λ=100nm, ME cell area = λxλ, ME delay = 100ps, Wave velocity = 10⁴ m/s, ME switching power =100nW]; CMOS designs at 45nm technology node

| Carry Operator | | |
|---|---|---|
| x | y | $x +_{carry} y$ |
| 0 | 1 | 0 |
| 0 | 3 | 0 |
| 1 | 1 | 0 |
| 1 | 3 | 1 |
| 2 | 1 | 0 |
| 2 | 3 | 1 |
| 3 | 1 | 1 |
| 3 | 3 | 1 |

| Mod-Sum Operator | | |
|---|---|---|
| x | y | $x \oplus y$ |
| 0 | 0 | 0 |
| 1 | 1 | 2 |
| 1 | 2 | 3 |
| 2 | 2 | 0 |
| 2 | 3 | 1 |
| 3 | 3 | 2 |

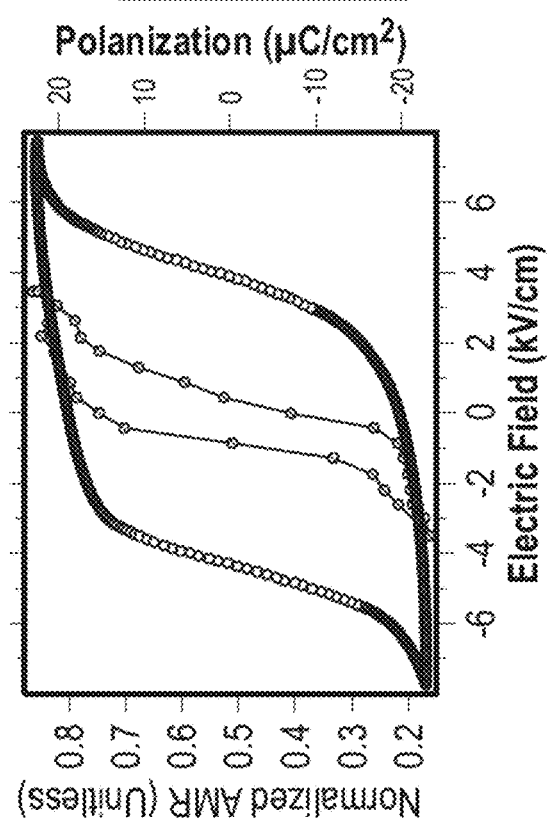
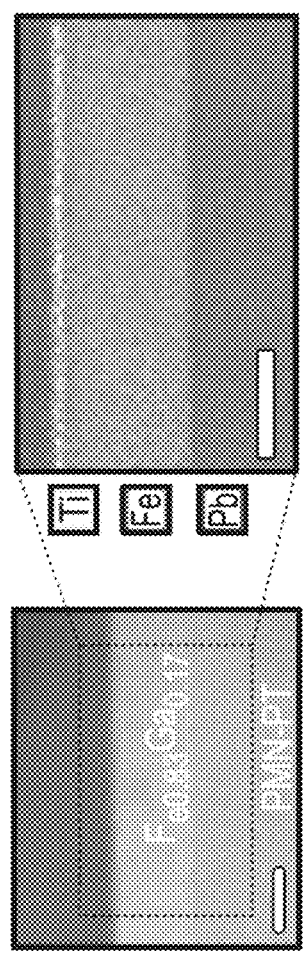
FIG. 17A
FIG. 17B
FIG. 17C

SEMICONDUCTOR CIRCUITS AND DEVICES BASED ON LOW-ENERGY CONSUMPTION SEMICONDUCTOR STRUCTURES EXHIBITING MULTI-VALUED MAGNETOELECTRIC SPIN HALL EFFECT

CROSS-REFERENCE TO RELATED APPLICATION

This patent document is timely filed on Jun. 12, 2017 to claim priorities to and benefits of U.S. Provisional Patent Application No. 62/348,803 entitled "SEMICONDUCTOR CIRCUITS AND DEVICES BASED ON LOW-ENERGY CONSUMPTION SEMICONDUCTOR STRUCTURES EXHIBITING MULTI-VALUED MAGNETOELECTRIC SPIN HALL EFFECT" and filed Jun. 10, 2016 since Jun. 10, 2017, the 1-year date from Jun. 10, 2016 falls on a Saturday. The entire content of the aforementioned patent application is incorporated by reference as part of the disclosure of this patent document.

TECHNICAL FIELD

This patent document relates to semiconductor devices exhibiting multi-valued states for performing logic operations or storing data.

BACKGROUND

Existing circuits tend to use binary-state circuits, especially for commercial devices or systems. For example, many semiconductor circuits and devices for digital logic operations are based on binary-state logic circuits as basic building blocks to construct various logic operation circuits by coupling or linking binary-state logic circuit building blocks in certain ways. In this regard, most CMOS technologies have been tailored for binary states and operate with binary switches to achieve desired logic operations. Although logic operations can also be achieved based on multi-valued states, various existing implementations of multi-valued logic circuits tend to be constructed by using binary-state logic circuit building blocks. In addition, various non-volatile semiconductor memory devices are constructed to exhibit two logic states for representing store data bits and this use of two logic states may limit information encoding.

SUMMARY

This patent document provides implementations and examples of magnetic semiconductor structures that exhibit more than two magnetic states as multi-valued state building blocks for constructing logic circuits and memory devices. The examples for implementing the multi-valued magnetic semiconductor structures include a ferromagnetic layer exhibiting a switchable magnetization in more than two different directions and a metal layer exhibiting a Spin Hall effect that are coupled to one another to construct low-energy consumption semiconductor structures exhibiting multi-valued states.

For logic circuitry based on such implementations, since the magnetic semiconductor structures exhibit native multi-valued states due to their structures and are used as the starting building blocks for logic operations, a logic circuit based on such implementations no longer need to couple different binary-state logic circuit building blocks together to first construct a multi-valued logic circuit as a multi-valued logic circuit building block to form desired multi-valued logic circuits. Hence, one of advantages of using multi-valued magnetic semiconductor structures based on the disclosed technology in this document is the reduction of circuitry elements and complexity in logic circuits as compared to some binary-state circuits and this can further lead to the energy reduction of logic circuits using the disclosed multi-valued magnetic semiconductor structures. The multi-valued magnetic semiconductor structures based on the disclosed technology can also be implemented in ways that enable information encoding and processing based on the multi logic values that may be difficult and inefficient to achieve by using binary logics, or allow elimination or reduction of unnecessary conversion from natural multi-valued parameters into binary representation in many applications.

Memory devices using the disclosed multi-valued magnetic semiconductor structures can also be designed with certain technical advantages, including, e.g., energy efficient memory devices with a better noise margin.

In one aspect, the disclosed technology can be implemented to construct a semiconductor device having a multi-layer structure forming a magnetoelectric or multiferroic system to include a ferromagnetic, magnetostrictive layer that exhibits a biaxial magnetic anisotropy and an underlying metal structure that exhibits a spin Hall effect to provide a conversion between electrical energy and magnetic energy with more than two distinctive magnetic states.

In another aspect, the disclosed technology can be implemented to construct a semiconductor device that includes a multi-state circuit that exhibits four different magnetic states. This multi-state circuit includes a multi-layer structure that includes a ferroelectric material layer that exhibits a piezoelectric effect and is operable to produce a strain in response to an electrical control signal applied to the ferroelectric material layer, a ferromagnetic material layer stacked with the ferroelectric material layer in a way to expose the ferromagnetic material to the strain produced by the ferroelectric material layer, and a spin Hall metal layer stacked with the ferroelectric material layer and the ferromagnetic material layer. The ferromagnetic material layer exhibits a biaxial magnetic anisotropy along two different magnetization axes that are stabilized by the strain from the ferroelectric material layer so that the ferromagnetic layer exhibits four different magnetization states based on two different magnetization directions in each of the two different magnetization axes. The spin Hall metal layer is configured to exhibit (1) a spin Hall effect in response to a charge current flowing in the spin Hall metal layer to produce a spin polarized current to flow into the ferromagnetic material layer along a direction perpendicular to the ferromagnetic material layer, and (2) an inverse spin Hall effect in response to a sensing current flowing through the ferromagnetic material layer and the spin Hall metal layer along a sensing current direction perpendicular to the ferromagnetic material layer and the spin Hall metal layer to produce a readout current along the spin Hall metal layer representing one of the four different magnetization states of the ferroelectric material layer. The multi-state circuit includes (1) a ferroelectric driver circuit that produces the electrical control signal applied to the ferroelectric material layer, (2) a charge current source circuit coupled to the spin Hall metal layer to generate the charge current flowing in the spin Hall metal layer, and (3) a sensing current source circuit coupled to produce the sensing current flowing through the ferromagnetic material layer to produce the readout current along the spin Hall metal layer.

In another aspect, the disclosed technology can be implemented to provide a method for operating a magnetic structure to produce different magnetic states from a ferromagnetic material layer exhibiting a biaxial magnetic anisotropy along two different magnetization axes so that the ferromagnetic layer exhibits four different magnetization states based on two different magnetization directions in each of the two different magnetization axes. This method includes coupling a ferroelectric material layer to the ferromagnetic material layer in a way to expose the ferromagnetic material to a strain produced by the ferroelectric material layer to enhance the two different magnetization axes as distinctive axes; coupling a spin Hall metal layer adjacent to the ferromagnetic material layer to respond to a charge current flowing in the spin Hall metal layer to produce a spin polarized current to flow into the ferromagnetic material layer along a direction perpendicular to the ferromagnetic material; and controlling an electrical control signal applied to the ferroelectric material layer to control the strain applied to the ferromagnetic material and the charge current flowing in the spin Hall metal layer to set the ferroelectric material layer in one of the four different magnetization states. In some implementations, this method may further include applying a sensing current flowing through the ferromagnetic material layer and the spin Hall metal layer along a sensing current direction perpendicular to the ferromagnetic material layer and the spin Hall metal layer to produce, via an inverse spin Hall effect in the spin Hall metal layer, a readout current along the spin Hall metal layer representing the one of the four different magnetization states of the ferroelectric material layer.

In another aspect, the disclosed technology can be implemented to provide a method for data storage in a multi-layer structure that includes a ferroelectric material layer that exhibits a piezoelectric effect and is operable to produce a strain in response to an electrical control signal applied to the ferroelectric material layer, a ferromagnetic material layer stacked with the ferroelectric material layer in a way to expose the ferromagnetic material to the strain produced by the ferroelectric material layer to produce a magnetostrictive response, the ferromagnetic material layer exhibiting a biaxial magnetic anisotropy along two different magnetization axes so that the ferromagnetic layer exhibits four different magnetization states based on two different magnetization directions in each of the two different magnetization axes and a spin Hall metal layer stacked with the ferroelectric material layer and the ferromagnetic material layer and configured to exhibit a spin Hall effect in response to a current flowing in the spin hall metal layer. This method includes applying a charge current in the spin Hall metal layer and an electrical control signal to the ferroelectric material layer to set a magnetization direction of the ferromagnetic material layer to be in a selected magnetization state of the four different magnetization states of the ferromagnetic material layer to store a data bit represented by the selected magnetization state. In some implementations, this method may further include applying, in a readout operation, a read current to flow through the ferromagnetic material layer to indicate which one of the four different magnetization states that the ferromagnetic material layer is in to readout a data bit represented by the magnetization state.

In yet another aspect, the disclosed technology can be implemented to construct a device to include different quaternary unit cells, where each quaternary unit cell is structured to include a monolithically constructed multilayer structure that includes different layers in a stack to exhibit four different native logic states and is programmable to switch from one native logic state to another. The different quaternary unit cells are coupled relative to one another to collectively perform logic operations based on the four different native logic states in each quaternary unit cell.

The above and other aspects, and their implementations and examples, are described in detail in the drawings, the description and the claims.

BRIEF DESCRIPTION OF DRAWINGS

FIG. 3 shows an example of a truth table showing a relationship among input control signals, magnetization direction and readout currents.

FIG. 17A to 17C show various data on characteristics of a multi-valued multiferroic device.

DETAILED DESCRIPTION

Figure 1:
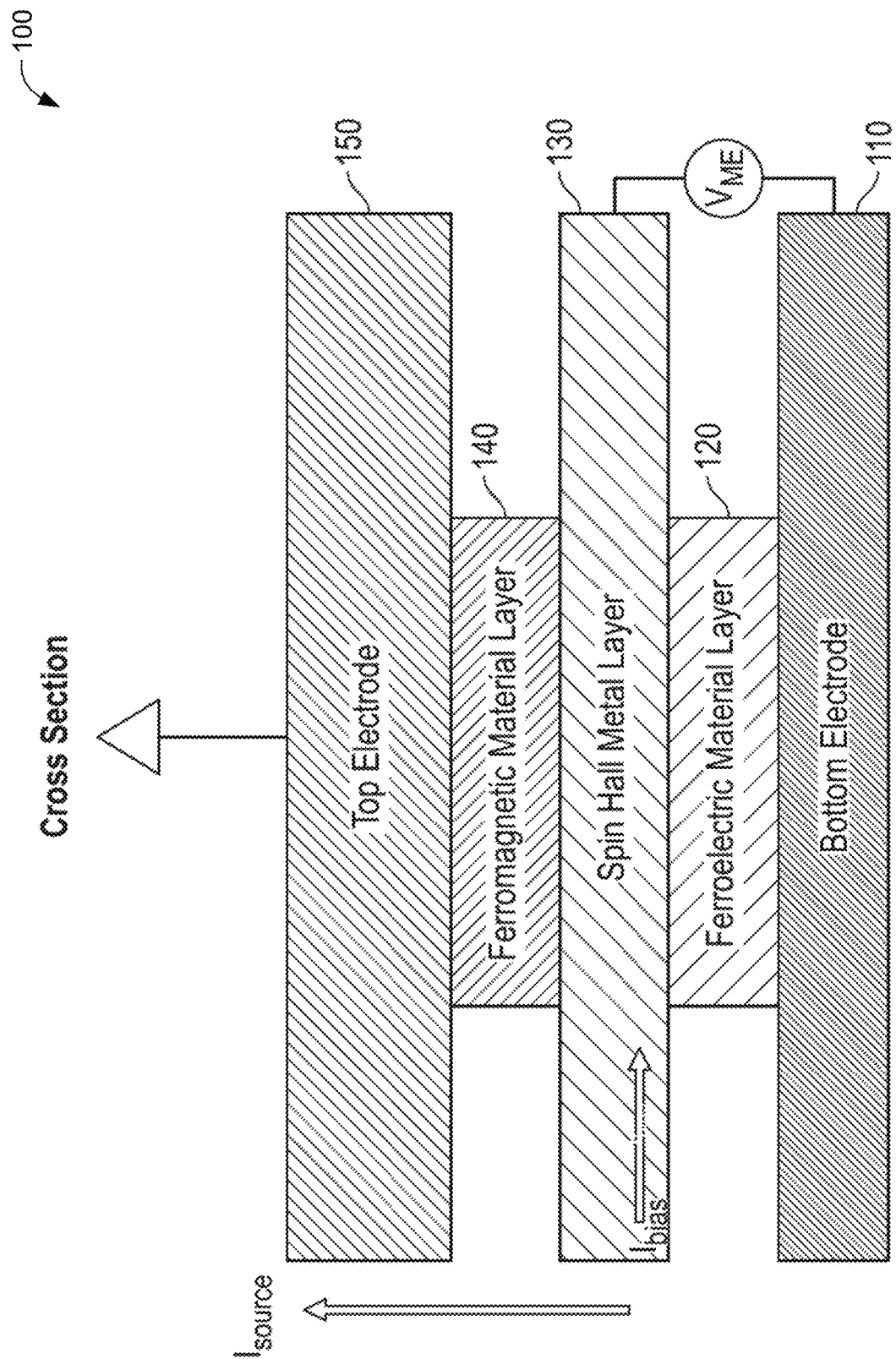
FIG. 1 shows a cross section view of an exemplary multi-valued semiconductor device with a magnetoelectric multiferroic configuration.

This patent document provides implementations and examples of circuits and devices based on low-energy consumption semiconductor structures exhibiting multi-valued states. The specific examples for implementing the disclosed technology use a multi-layer magnetic structure that exhibits more than two distinctive states as native multi-valued states and is operable to switch between such different states. The disclosed technology can be used in various applications, including, e.g., logic circuits and devices and memory circuits and devices.

As specific examples shown in FIGS. 1 and 9 through 13, multi-valued magnetic structures (or multi-valued multiferroic structures) can be constructed based on the spin Hall effect and piezoelectric or magnetoelectric effect. In those examples, a magnetostrictive ferromagnetic is deposited onto a ferroelectric or piezoelectric layer and the resultant structure forms a magnetoelectric or magnetoelectric multiferroic structure (or a composite multiferroic).

Magnetoelectric multiferroic composites are attractive materials for various electrically and magnetically crosscoupled devices. The multiferroic component processes both electric and magnetic orders and this coupling enables control of magnetization polarization with electric field. One example of an implementation of the disclosed technology can use magnetoelectric multiferroic materials to construct a current-based device with more than two digital states, e.g., four distinct digital states. One of the functions of the multiferroic component is its ability to transduce electrical energy into magnetic energy and vice versa (magnetic energy into electrical energy). The multifunctional properties of multiferroics enable the design of novel electronic devices for various sensing, transduction, memory and logic applications.

The disclosed multi-valued magnetic structures can be used to implement various circuit configurations that address certain technical limitations in various semiconductor devices based on binary circuits. Most commercial circuits and devices based on complementary metal oxide semiconductor (CMOS) technology implement a binary logic. Limited by the two logic states in binary circuits, such CMOS circuits connect or couple different binary logic circuits together to perform more complex logic operations. Inherently, such CMOS circuits require different logic gates, circuit connections and switches and tend to introduce delays, increase power consumptions and increase the circuit size and complexity due to the presence of gates, connections and switches.

Multi-valued states with more than two states can be achieved in a single integrated circuit element disclosed in this patent document that is formed from monolithically integrated semiconductor layers to exhibit multiple native magnetic states without extra logic gates or other connecting switches. Therefore, the disclosed technology can be implemented to reduce the number of logic gates, circuit connections, or switches in logic circuitry to reduce the overall circuit complexity, to reduce overall circuit size and footprint, to reduce delays and the power consumption in comparison with binary-based logic circuitry for complex logic operations. Accordingly, the disclosed technology can be advantageously used in various computation intensive applications, such as image processing, big data analytics, many-valued decision diagrams, artificial neural networks and others. Among other advantages and benefits, the multi-valued logic allows compact data and functional representation, and is more efficient than the binary logic. At this time, multi-valued logic circuitry has not been successfully used in practical applications in part because since existing CMOS technologies are based on binary logic and certain attempts for developing multi-valued logic circuitry are based on binary logic circuits as basic building blocks, e.g., using different binary CMOS units and binary switches to construct a multi-valued logic circuit. This configuration using multiple CMOS units and binary switches requires multiple conversions between the intrinsic binary logic and the multi-valued logic. Accordingly, the multi-valued CMOS based logic demands increased power consumption and have complicated structures for communication, computation, and data representation. The new approach disclosed in this patent document provides improvements from the existing performance of the multi-valued CMOS based logic in terms of energy reduction and simplified configuration.

The disclosed technology can be implemented to provide a native or intrinsic multi-valued multiferroic device and can be used to build a powerful architecture with the potential to achieve significant energy savings in comparison to the CMOS based implementation due to the reduction in the number of elements and connections. The disclosed technology can be used to, among other applications, resolve this issue by creating an intrinsically multi-valued device element without relying on binary logics and associated computing framework that harness pull potentials of the device, and allows data representation, communication and computation in the multi-valued domain. Energy improvements in performance of logic structures harnessing this quaternary device are estimated to be greater than a factor of 100 when compared to end-of-roadmap CMOS logic structures. Implementations of the disclosed technology can be configured in ways that achieve at least signficant reduction in energy consumption (e.g., 100 times). The potentials of the suggested device can make significant impacts to the semiconductor industry, and can transform the existing computing paradigms that are solely based on binary logic. Targeted applications can range from microprocessors, memories to custom data-centric chips that require data inference and processing capabilities to be built-in with memory.

FIG. 1 shows a cross section view of an exemplary multi-valued semiconductor device with a magnetoelectric multiferroic structure that exhibits native multi-valued states of four different magnetization states based on a ferromagnetic, magnetostrictive layer that exhibits a biaxial magnetic anisotropy and an underlying metal structure that exhibits a spin Hall effect to provide a conversion between electrical energy and magnetic energy.

As an example, the multi-valued states are implemented with the magnetoelectric multiferroic structure having more than two magnetization directions and the rotation among the four magnetization directions are controlled via the piezoelectric effect and the spin Hall effect. As shown in FIG. 1, the magnetoelectric multiferroic structure includes a ferroelectric material layer 120, a spin Hall metal layer 130, and a ferromagnetic material layer 140. For example, the multi-valued device sits on a ferroelectric or piezoelectric film or substrate which provides the strain to the magnetostrictive layer when a voltage is applied across the ferroelectric via the piezoelectric effect and due to magnetostriction causes the magnetization of the magnetostrictive layer to rotate. In the disclosed technology, a magnetoelectric multiferroic element enables the system responsive to an electric field which makes it an energy efficient system. The magnetoelectric multiferroic element includes materials that exhibit both magnetic and electric aspects. The magnetic properties of the magnetoelectric multiferroic materials can be controlled by applying an electric field whose value is not significant as compared to the switching in the conventional semiconductor circuit and devices. Accordingly, the magnetoelectric multiferroic element enables the design of novel electronic devices for various sensing, transduction, memory and logic applications. In particular, artificial (or composite) multiferroics exhibit the largest transduction coefficients at room temperature. Composite multiferroics are typically bilayers formed of a ferromagnetic material with large magnetostriction coefficients and a piezoelectric material with large piezoelectric coefficients (these are typically ferroelectric as well, but not necessarily required to be). The magnetoelectric multiferroic structure is arranged between the bottom electrode 110 and the top electrode 150. The top electrode 150 operates as a passivation layer to protect the magnetoelectric multiferroic structure from unnecessary oxidation. The bottom electrode 110 operates to provide the contact with the spin Hall metal layer 130 to apply the electric field to the ferroelectric material layer 140 and drive the piezoelectric strain. In some implementations, the top electrode 150 may be formed by various electrically conductive materials, including metallic materials such as Pt, Cu, Ti, Au, or Al. The multi-valued multiferroic device shown in FIG. 1 is one example only and can be modified in various manners, for example, to have different arrangements of the layers, include different materials, or include layers with different thickness. In some implementations, the thickness of respective materials may be dependent on the spin diffusion length (or effective spin diffusion length) of the elemental layer (or bilayer). In certain applications, the thicknesses range may be from 5 to 20 nm, although other implementations are also possible.

Figure 2:
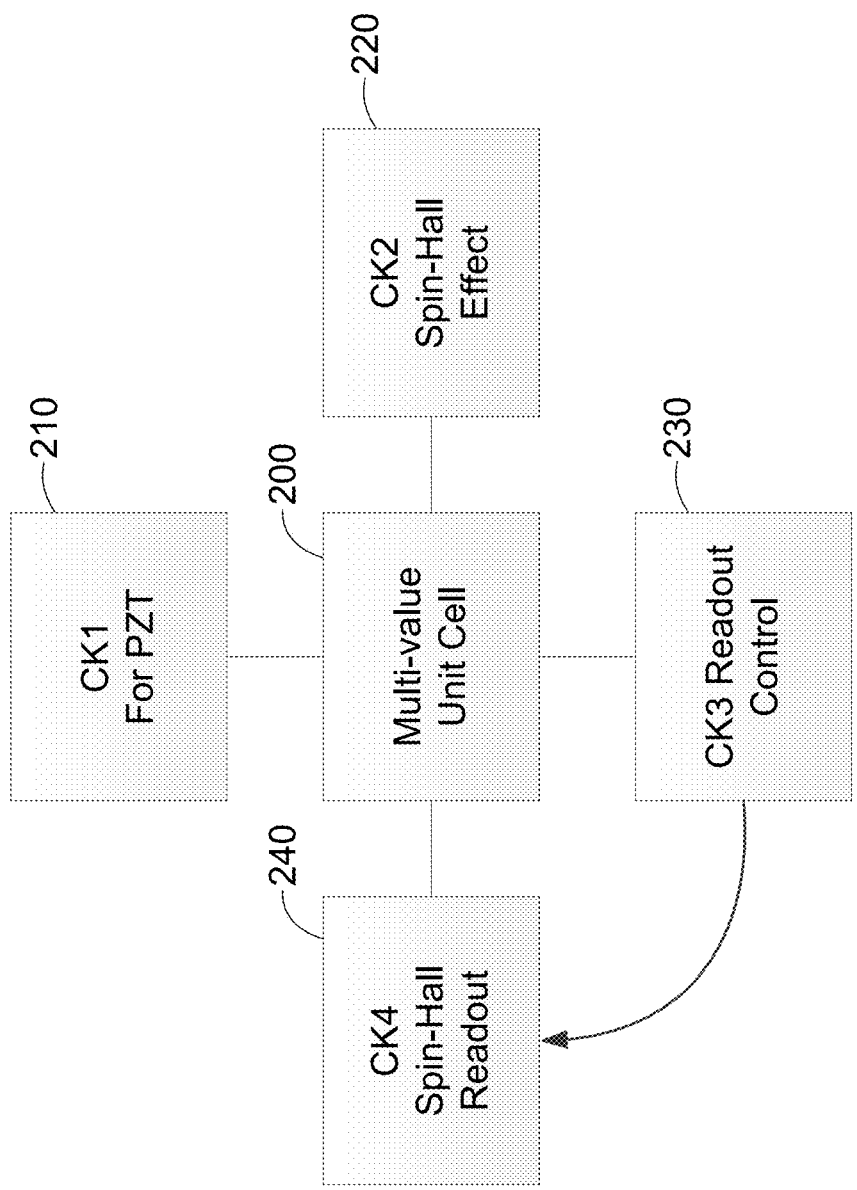
FIG. 2 shows an exemplary circuit configuration that controls a magnetoelectric multiferroic structure to operate as a multi-valued device.

The ferroelectric material layer 120 is configured to exhibit a desired piezoelectric effect and generate a piezoelectric strain in response to an electrical control signal applied to the ferroelectric material layer 120. FIG. 2 shows exemplary configuration that controls the magnetoelectric multiferroic structure to operate as a multi-valued device. In FIG. 2, CK1 210 is coupled with the multi-value unit cell 200 to supply an electrical signal to the multi-value unit cell 200, which causes the ferroelectric material layer 120 to generate the piezoelectric strain. As will be further described later, the piezoelectric strain generated by the ferroelectric material layer 120 operates to manipulate the switching of the magnetization of the ferromagnetic material layer 140 along with the spin torque charges generated by the spin Hall metal layer 130. Using the piezoelectric strain produced in the ferroelectric material layer 120 makes it possible to decrease the critical switching current required to switch the magnetization of the device. Also, it allows a smaller programming current required for a write operation. Various suitable materials are selected for the ferroelectric material layer 120 to have a desired piezoelectric effect. Table 1 below shows the list of possible materials and their piezoelectric coefficients, d33 and d31. The materials can be used in single form or various combination among the materials can be made for the ferroelectric material layer 120.

TABLE 1

| Material | d33 (pC/N) | d31 (pC/N) |
|---|---|---|
| LiNbO$_3$ | 27 | |
| AlN | 6 | |
| PMN-PT | 2500 | −1000 |
| LiTaO$_3$ | 16 | |
| Quartz | 2.3 | |
| BaTiO3 | 190 | −80 |
| PZN-PT | 2500 | −1500 |
| ZnO | 5.9 | |
| SrTiO3 | | |
| PZT | 60-130 | −320 |
| PIN-PMN-PT | 900-1200 | |
| BFO | 60 | |
| (K$_{0.5}$Na$_{0.8}$)NbO$_3$ | 80 | |
| NBT-BT (Na$_{0.8}$Bi$_{0.5}$)TiO$_3$—BaTiO$_3$ | | 64 |

List of piezoelectric materials and their piezoelectric coefficients

The spin Hall metal layer 130 is arranged with the ferroelectric material layer 120 in direct or indirect contact with the ferroelectric material layer 120 and operates together with the ferroelectric material layer 120 to collectively trigger the switching of the magnetization in the ferromagnetic material layer 140. A challenge for realizing a four-state device is that, when switched, the magnetization can rotate by ±90° and whether it rotates 90° to the left or 90° to the right is not deterministic. The spin Hall metal layer 130 is configured to exhibit a spin Hall effect which generates spin torque charges in response to a charge current ($I_{bias}$ in FIG. 1) applied to the spin Hall metal layer 130. Referring to FIG. 2, CK2 220 is coupled to the multi-valued unit cell 200 to provide the charge current $I_{bias}$ to the spin Hall metal layer 130. The spin Hall metal layer 130 can be arranged adjacent to the ferromagnetic material layer 140 or in direct contact with the ferromagnetic material layer 140 to allow the spin torque current generated via a spin Hall effect under the charge current to enter the ferromagnetic material layer 140. The spin Hall metal layer 130 has a suitable thickness in terms of the conversion efficiency between the charge current and the spin torque current. In some implementations, the spin Hall metal layer has a thickness, e.g., 6 to 9 nm thick. In some implementations, the spin Hall metal layer 130 may be intentionally lithographically aligned to form an angle with respect to the magnetic anisotropy directions of the ferromagnetic material layer 140 to create the spin Hall torque to bias the 90° switching left or right. The angle formed between the spin Hall metal layer 130 and the magnetic anisotropy directions of the ferromagnetic material layer 140 can change depending on materials configuration. Examples of possible materials for the spin Hall metal layer 130 includes at least one of Pt, Ta, W, Bi$_2$Se$_3$, Au or Bi, or metals doped with large spin-orbit-coupled impurities.

In the disclosed technology, the magnetization of the ferromagnetic material layer 140 is manipulated based on both the spin torque current obtained via the spin Hall effect and the piezoelectric strain via the piezoelectric effect. By using the both of the spin Hall effect and the piezoelectric strain, the manipulation of the magnetization can be more accurate and precise while achieving energy reduction in operating as the multi-valued device. For example, the piezoelectric strain obtained from the ferroelectric material layer 120 make the magnetization of the ferromagnetic material layer to rotate without the need for a separate circuit for providing switching currents. In rotating among possible magnetization directions, the spin torque current obtained from the spin Hall metal layer 130 allows the control of the rotation to be done in a deterministic manner. In addition, since the current applied through the spin Hall channel is to generate just a bias and not to switch the magnet, the contribution to the energy dissipation per switch from the spin Hall bias is not significant. The spin Hall metal layer 130 may be used for the writing operation as well as part of the read operation. For the writing operation, a current is sourced through the spin Hall metal layer 130 as a voltage is applied across the piezoelectric or ferroelectric. The current creates the spin torque current to bias the 90° switching left or right.

The ferromagnetic material layer 140 is configured to have more than two magnetization states that are rotatable by the spin torque charges generated via the spin Hall effect. In the present implementation, as an example of the multi-valued multiferroic device, the ferromagnetic material layer 140 has four different magnetization states and the magnetostrictive ferromagnet has an in-plane biaxial magnetic anisotropy meaning every 90° is a preferred orientation of the magnetization, with energy barriers preventing the magnetization from moving between these biaxial states. However, other implementations are also possible regarding the magnetization directions. For example, the four magnetization directions may be all in-plane or can be configured in a combination of the in-plane and out-of-plane directions (for example, 2 in-plane and 2 out-of-plane). Some implementations of the disclosed technology can use the ferromagnetic material layer 140 with ferromagnetic materials having two magnetization axes that are already defined and two additional magnetization axes that are created in response to an external strain. Some other implementations of the disclosed technology can use a magnetoelectric or multiferroic system with biaxial magnetic anisotropy either intrinsically present or induced by strain on the ferromagnetic, magnetostrictive layer. In this regard, high-quality, ferromagnetic magnetostrictive films are formed on high piezoelectric coefficient materials.

Table 2 below shows the list of possible materials for the ferromagnetic material layer 140 and their magnetorestriction coefficients. The materials can be used in single form or various combination among the materials can be made for the ferroelectric material layer 140. In some tests and prototypes for the multi-valued multiferroic device, the $Fe_{1-x}Ga_x$ (x is in the range of 0.17 to 0.19 in the structures investigated, but high magnetostrictive coefficients exist beyond this range) on PMN-PT ($(1-x)PbMg_{1/3}Nb_{2/3}O_3$-(x) $PbTiO_3$) and $Fe_{1-x}Ga_x$ on $BaTiO_3$ systems achieved the desired properties, but many other variations can be made to configure the ferromagnetic material layer 140.

TABLE 2

| Material | Magnetostriction coefficient $\lambda s$ (μɛ) |
|---|---|
| Ni | −34 |
| Co | −62 |
| Fe | −7 |
| $Co_{45}Fe_{55}$ | 65 |
| $Co_{50}Ni_{50}$ | 25 |
| $Ni_{80}Fe_{20}$ | 1 |
| $Ga_{18}Fe_{81}$ | 250 |
| $(Ga_{19}Fe_{81})_{88}B_{12}$ | 70 |
| $Co_{80}Fe_{20}B_{20}$ | 50 |
| CoFeSiB | 45 |
| $Tb_{33}Fe_{67}$ | 1753 |
| $(Tb_{30}Dy_{70})Fe_{1.9}$ | 1200 |
| $Fe_3O_4$ | 40 |
| $CoFe_2O_4$ | −110 |
| $(MnZn)Fe_2O_4$ | −3 |
| $NiFe_2O_4$ | −17 |
| $Y_3Fe_5O_{12}$ | 1 |

List of ferromagnets and their magnetostriction coefficients

The disclosed technology proposes the integration of an energy efficient composite multiferroic or magnetoelectric structure that is capable of having four stable (non-volatile) magnetization states. With the magnetoelectric multiferroic structure, the suggested multi-valued device exhibits the magnetoelectric effect and the spin Hall effect that deterministically put the magnetization into any of these four states. To guarantee that a desired state is reached by the writing operation, the device requires two synchronous voltage and current pulses. For example, the spin Hall current ($I_{bias}$ in FIG. 1) flowing in the spin Hall metal layer 130 and the voltage ($V_{ME}$ in FIG. 1) applied between the spin Hall metal layer 130 and the bottom electrode 110 operate as control signals for the writing operation to write one of the four data bits of the multi-valued multiferroic device.

FIG. 3 shows an exemplary truth table showing a relationship among input control signals, output magnetization direction and readout currents. The truth table can vary depending on material choices and configuration of the device and the table in FIG. 3 is only one example and other implementations are possible. In some implementations, the input control signals are illustrated as four different combinations of the spin Hall currents ($I_{bias}$ in FIG. 1) and the voltages ($V_{ME}$ in FIG. 1) to exhibit four different states of the multi-valued multiferroic device. During the writing operation, the control signals may be maintained to have one fixed value or changed to different values. If the control signals change during the operation, the writing operations is performed such that the spin Hall currents and/or the voltages are switched between different values at the predetermined operation timings. To do this, a timing circuit may be added to provide proper gaps. As the result of the writing operation with the input control signals, the ferromagnetic material layer 140 has a particular magnetization direction among four different directions. The particular state of the multi-valued multiferroic device is read out by measuring the readout current obtained via the inverse spin Hall current effect, i.e., the inverse spin Hall current. Referring to FIG. 2, CK230 is coupled to the multi-valued unit cell 200 to provide the input control signal and CK4 240 is coupled to the multi-value unit cell 200 to readout the inverse spin Hall current flowing in the spin Hall metal layer 130.

The operation of the device comes from manipulating the magnetization of the ferromagnetic material layer 140 through piezoelectric strain from the underlying ferroelectric material layer 120 and from a small bias current to generate the spin Hall torque on the ferromagnetic material layer 140 that can flow through the spin Hall metal layer 130. The multi-valued multiferroic device enables deterministic and non-volatile switching between all four possible magnetization directions (for example, 0, 90°, 180°, and 270°) utilizing the spin Hall metal layer 130 to which a bias current is applied, providing a spin torque via the spin Hall effect. The state of the device is read out (any of the 4 states) using the same spin Hall metal layer 130 via the inverse spin Hall effect (this readout is via the inverse spin Hall current). At the interface between the ferromagnetic material layer 140 and the spin Hall metal layer 130, spin polarized electrons that enter the spin Hall metal layer will generate a horizontal current generated in the spin Hall metal layer 130 via the inverse spin Hall effect, which is referred to the inverse spin Hall current. The multi-valued multiferroic device employs a magnetoelectric multiferroic material that exhibits a spin Hall effect layer and an inverse spin Hall effect layer. The magnitude of the inverse spin Hall current (2 strengths) and its sign depend on the direction of magnetization of the magnetostrictive ferromagnetic layer. As one example, the truth table of FIG. 3 shows four possible read out currents 3I, I, −I, −3I, which corresponds to the respective magnetization directions. This writing and reading operations make it possible to operate the suggested device as the multi-valued logic and/or memory device with four different states. In some implementations, the input to the multi-valued multiferroic device is a current and a voltage, and the output of the multi-valued multiferroic device is a current that can have multiple values (e.g., for quaternary logic: 4 values by combining polarity and magnitude) depending on the configuration of the magnetic layer of the magnetoelectric or multiferroic.

Figure 4:
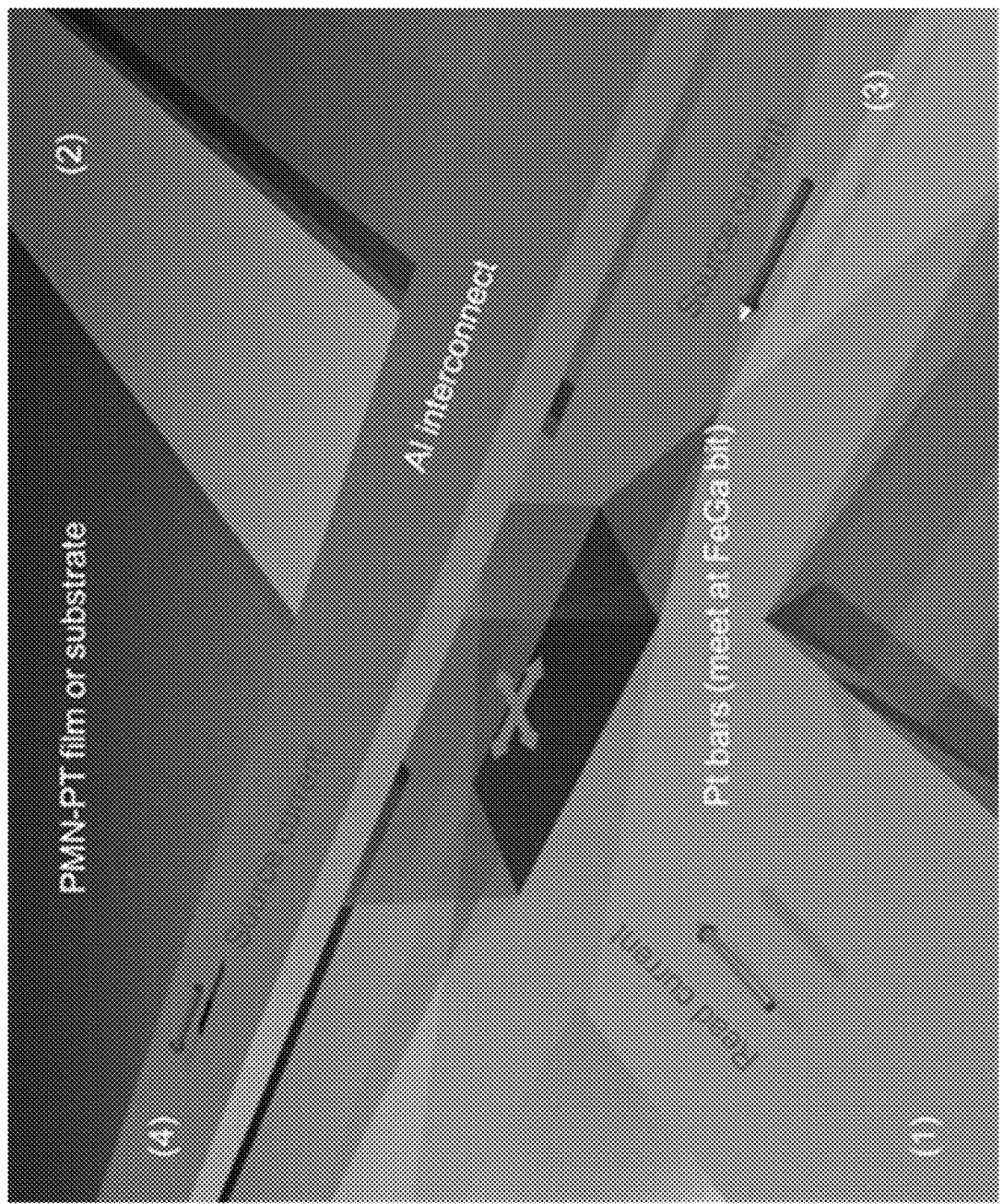
FIG. 4 shows a simplified 3D diagram showing an exemplary multi-valued multiferroic device with indications of source currents and readout currents.

FIG. 4 shows a simplified 3D diagram showing an exemplary multi-valued multiferroic device with indications of source currents and readout currents. In the exemplary device of FIG. 4, the spin Hall metal layer 130, the ferromagnetic material layer 140, and the top electrode 150 are configured as the Pt layer, the FeGa layer, and the Al layer, respectively. The spin Hall metal layer 130 layer is patterned into a cross bar like structure, with the bar defined by contact nodes (1) and (2) in FIG. 4. In FIG. 4, the spin Hall metal bar is inclined at a 18.5° angle with respect to the magnetic anisotropy directions of the magnetostrictive ferromagnet. Contact node (3) and the bottom electrode (not shown) are configured to apply a voltage to the ferroelectric material layer 120 (e.g., PMN-PT) to drive magnetoelectric switching. The source current flows vertically through the device using contact nodes (3) and (4). Contact nodes (1) and (2) are used for sourcing the spin Hall current to enable deterministic magnetization switching and measurement of the state of the device through the inverse spin Hall effect when the readout source current is applied. The suggested multi-valued multiferroic device is a current-based readout device, as the horizontal current flowing through contact nodes (1) and (2) will be modulated in amplitude and sign (current inversion is possible and necessary in our logic system) with the appropriate choices of magnetization direction (write operation).

In the examples shown in FIGS. 1, 2, 3 and 4, the multi-layer magnetic structure in FIG. 1 exhibits a quaternary unit cell architecture with four different magnetic states that can be reprogrammable and controlled by a combination of a ferroelectric driver circuit that produces the electrical control signal applied to the ferroelectric material layer and a charge current source circuit coupled to the spin Hall metal layer to generate the charge current flowing in the spin Hall metal layer. The specific magnetic state of this quaternary unit cell architecture can be sensed or measured by operating a sensing current source circuit that is coupled to produce the sensing current flowing through the ferromagnetic material layer to produce the readout current along the spin Hall metal layer. This aspect of using a single multi-layer magnetic structure such as the example shown FIG. 1 to achieve 4 different logic states can provide unique advantages in complex logic operation circuits by using this quaternary unit cell architecture in several areas including circuit footprint, circuit complexity, processing speed and energy consumption. The presence of the ferroelectric driver circuit, the charge current source circuit and a sensing current source circuit may require certain footprint on a chip for each quaternary unit cell. However, versatile logic operations that can be performed by such a quaternary unit cell and its performance and its processing speed and the low-energy consumption enables significant advantages to be gained when building complex logic operations circuits by using two or more such quaternary unit cells since the number of the quaternary unit cells, the circuit connections and needed switches for complex logic operations circuits can be significantly reduced when compared to complex logic operations circuits with the same or similary functionality by using binary logic gates.

Figure 5:
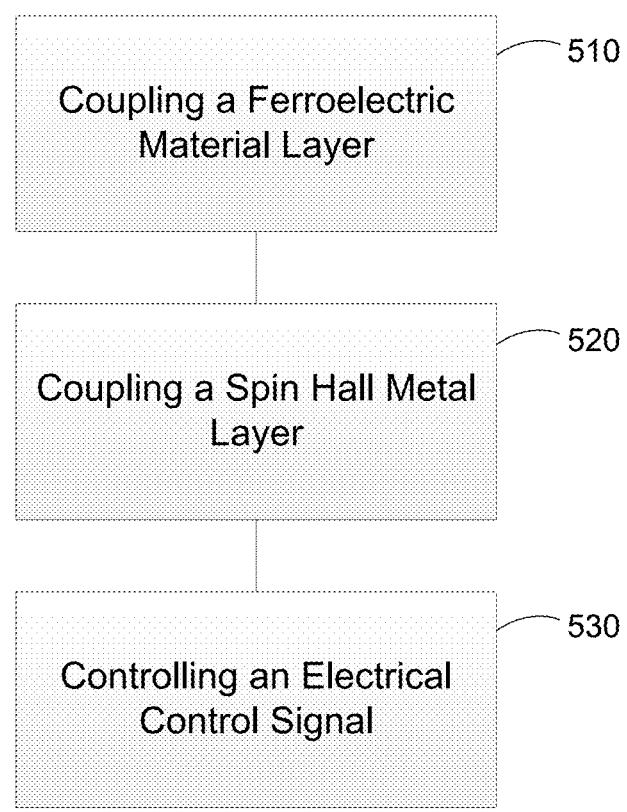
FIG. 5 shows an exemplary flow chart for operating a multi-valued multiferroic device.

FIG. 5 shows an exemplary flow chart for operating a multi-valued multiferroic device. As discussed, the multi-valued structure is provided to include the ferroelectric material layer, the spin Hall metal layer, and the ferromagnetic material layer. At step 510, the ferromagnetic material layer is coupled to the ferromagnetic material layer to expose the ferromagnetic material to a strain produced by the ferroelectric material layer to enhance the two different magnetization axes. The strain is produced by applying the electric charge to the ferroelectric material layer. At step 520, the spin Hall metal layer is coupled to the ferromagnetic material layer to respond to the charge current flowing in the spin Hall metal layer. In response to the charge current, the spin Hall metal layer produces the spin polarized current that flows into the ferromagnetic material layer along a direction perpendicular to the ferromagnetic material layer. At step 530, the control signals are controlled to control the strain applied to the ferromagnetic material and the charge current flowing in the spin Hall metal layer to set the ferromagnetic material layer in one of the four different magnetization directions. The exemplary control signals inputted to the multi-valued multiferroic device are described with regard to FIG. 3.

The disclosed technology in this patent document is in part based on the recognition that achieving energy reduction by a significant factor (e.g., at least 100×) in comparison to end-of-roadmap binary CMOS devices can be difficult to achieve by remaining with a conventional binary architecture and the recognition that is also difficult to achieve such reduction in power consumption with a charge-based circuit or device. In recognition of those challenges, the disclosed technology proposes combining two very distinct ideas by creating a magnetoelectric multiferroic (non-charge based) device, which is specifically designed to function in a multi-valued (4-state, quaternary) architecture. In some implementations, the suggested technology proposes merging multi-valued logic with the spin-based device technology.

Figure 6:
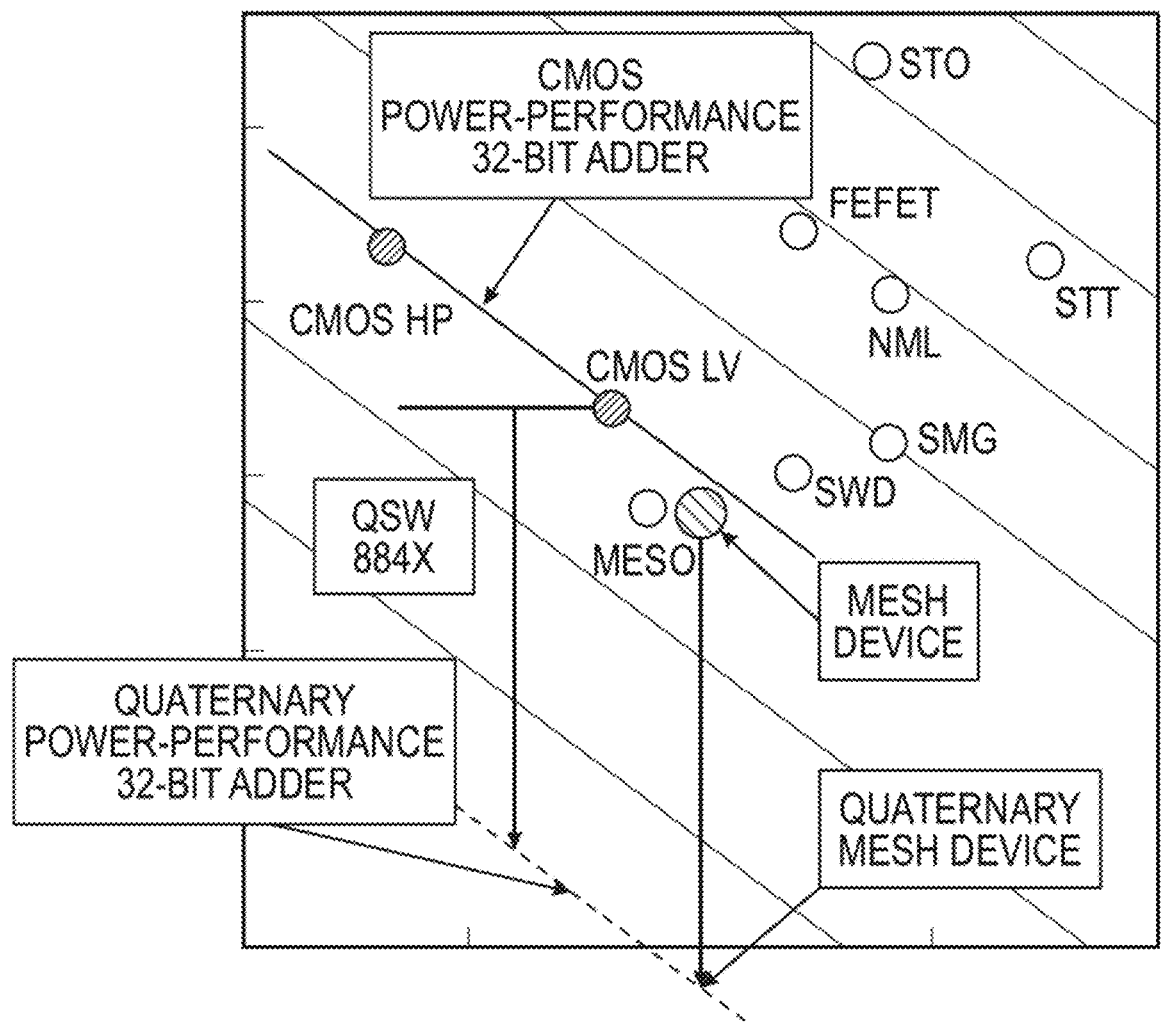
FIG. 6 shows evaluations of a related quaternary logic architecture suggested in this patent document and CMOS based logic architecture.

FIG. 6 shows evaluations of a related quaternary logic architecture suggested in this patent document and CMOS based logic architecture. In FIG. 6, the adders constructed using the suggested magnetoelectric spin Hall device or MESH device show performance improvements in comparison with the conventional CMOS adders. From the table, it is estimated that the suggested multi-valued multiferroic device can achieve more than 100×in energy improvements over the CMOS based architecture at the same performance level. For example, the evaluations in FIG. 6 suggest a 63×density improvement, 884×power improvement, and 3×performance improvement for a 32-bit full adder versus a CMOS equivalent. In FIG. 6, background data for the 32 bit adder is simplified and adapted. As already discussed in the beginning part of this document, the energy reduction obtained in the suggested device is the results of several aspects including the unique approach to create an intrinsically multi-valued structure having multi-valued states. The capability of exhibiting multi-valued states enables to reduce the number of unit cells needed to configure a logic application, simplify interconnection requirements, and provides lower complexity in computation and communication.

The multi-valued multiferroic device suggested in this patent document can be used in various application including logic and/or memory systems. The intrinsic properties of the multi-valued multiferroic device that exhibit multi-valued states allows to represent multi-valued logics without binary switches. Using the physical functional elements as the building blocks realizes the complex logic-arithmetic in a single step natively and thus are more sophisticated than switches. The suggested new device along with the novel computing framework can enable merged logic-memory fabric that can (i) merge computation with memory leading to a distributed architecture with a lesser degree of localization for execution and memory units, reducing computation and communication requirements; and (ii) potentially surmount the memory-wall problem that impacts CMOS processors. Beyond microprocessors and memory replacements, application drivers for such technology will include complex processing and data intensive applications.

Contrary to CMOS, where binary switches are used in a Boolean computing framework, the suggested multi-valued multiferroic devices are used in multi-valued computing framework where data representation, communication and computation are all in multi-valued domain. The unique features of the computing framework are (i) the Interference Functions: formalism for multi-valued logic implementations, which are analogous to Boolean functions in multi-valued domain, (ii) implementations of multi-valued logic using the novel magnetoelectric device. The combination of the ultra-low power multi-valued multiferroic device and supportive computing framework offers at least 100×energy improvement over end-of-roadmap CMOS. Interference Functions (IF) are key enablers for the implementation of multi-valued logic using these novel multi-valued devices. They are a set of new principles that allow implementation of multi-valued logic using signal superposition technique. These functions are generic and can be used with any physical element that exhibit controllable multi-valued characteristics. Contrary to conventional binary CMOS and Majority based logic design approaches that implements core {AND, OR, NOT} operators and majority functions, IF provide formalism to implement functionally complete set of {Min, Max, Threshold, Literal, Cyclic} operators for realizing any multi-valued logic.

As already discussed with regard to FIG. 3, the multi-valued multiferroic device can be configured to have four different readout currents (3I, I, −I, −3I) and can be used to provide a quaternary data representation (radix-4) for complex logic operations.

FIGS. 7A and 7B further show an exemplary illustration of quaternary data encoding for a multi-valued multiferroic device with four different native states. To represent data in radix-r number system, IF requires r/2 distinct amplitude values if r is even, and (r+1)/2 amplitude values if r is odd, in conjunction with 2 phases or switching polarities. For quaternary data representation (radix-4), two amplitude levels (A, 3A) in conjunction with switching polarities (+, −) are used to get four different combinations. Quaternary data representation utilizing symmetric I-V characteristics is shown in FIG. 7A. Each combination is assigned to a logic value as shown in the Table in FIG. 7B. Alternative combinations for amplitude and polarity may also be used. In contrast to IF, conventional charge-based digital computational systems are capable of using only the presence/absence of charge for one-dimensional binary information representation.

Multi-valued operators are designed using multi-valued devices. To implement multi-valued operators, descriptions on IFs are followed. In Equation below, a logical state X is represented using amplitude (a) and polarity dependent parameter (k) as:

$$\tilde{X} = ak$$

$$k = \text{or } + \text{ or } -$$

The Interference Function I of n input states $\tilde{X}_0, \tilde{X}_1, \ldots \tilde{X}_{n-1}$ can be defined as follows:

$$I(\tilde{X}_0, \tilde{X}_1, \ldots, \tilde{X}_{n-1}) = \tilde{X}_0 + \tilde{X}_1 + \ldots + \tilde{X}_{n-1} = a_0 k_0 + a_1 k_1 + \ldots + a_{n-1} k_{n-1} = a_y k_y$$

The result of this Interference Function is a logical state Y, whose amplitude is $a_y$ and polarity dependent parameter is $k_y$. In general for n inputs, if the amplitude of any input $\tilde{X}_j$ is $a_j = w_j \cdot A$, where $w_j$ represents a weight in multiples of unit-amplitude A, then the Interference Function result encodes the following information:

$$a_y = I^A(\tilde{X}_0, \tilde{X}_1, \ldots, \tilde{X}_{n-1}) = \left|\sum w_j k_+\right| - \left|\sum w_m k_-\right|$$

$$a_k = I^k(\tilde{X}_0, \tilde{X}_1, \ldots, \tilde{X}_{n-1}) =$$

$$\begin{cases} \pi; & \text{if } \sum w_j A e^{i\pi} > \sum w_k A e^{i0} \\ 0; & \text{else} \end{cases} \text{ or } \begin{cases} +; & \text{if } \sum w_j > \sum -w_k \\ -; & \text{else} \end{cases}$$

The output polarity encodes the weighted majority decision of all the input polarities, and the amplitude represents the weighted difference of the number of inputs that are out-of-phase with respect to each other. Thus the Interference Function is much more than a simple Majority, and it results in a signal that encodes all the necessary information about the inputs in a compressed manner. Below are details of multi-valued operator implementation using IF. Respective schematic based implementations are shown in FIGS. 8A to 8E. In FIG. 8A to 8E, the square blocks represent multi-value unit cells with the multiferroic structure and operate as input, output, and intermediate cells to provide corresponding logic operators.

Figure 8A:
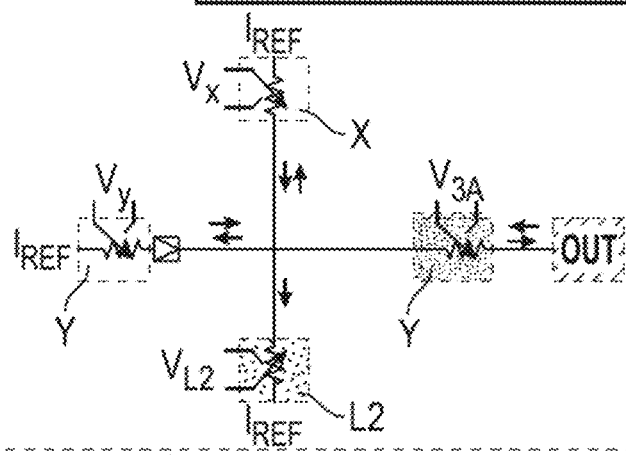
FIGS. 8A to 8E show examples of logic operators by using native multi-valued semiconductor devices based on the disclosed technology as building blocks.

FIG. 8A shows a physical implementation of an upper threshold operator configured with multi-value unit cells and its truth table. The operator of FIG. 8A is configured with the two-input multi-value cells (X, Y), the intermediate multi-value cells (L2, Y), and the output multi-value cell to realize multi-valued threshold functions. The intermediate multi-value cell L2 generate waves corresponding to logic 2. In these operations, when one input is above or below the other input in terms of logic value, a constant output is selected. The Upper Threshold operator $(x_y^{r-1})$ is defined as:

$$x_y^{r-1} = \begin{cases} r-1, & \text{when } x \geq y \\ 0, & \text{else} \end{cases}, x, y \in \{0, 1, \ldots, r-1\}.$$

For radix-r it is expressed in terms of Interference Function as:

$$\tilde{X}_y^{r-1} = I[(r-1)I_1^k(-\tilde{X}, \tilde{Y}, \tilde{L}_{r/2})],$$

where (r−1) represents either r−1 copies of interference output at I1 or amplification; $\tilde{X}$, $\tilde{Y}$ are logical inputs x, y respectively; and $\tilde{L}_{r/2}$ is corresponds to logic level r/2. Interference Function I1 produces a positive output signal/wave when (x≥y), and generates a negative signal/phase otherwise. The Lower Threshold operator $(^{r-1}{}_y x)$ is opposite of upper Threshold, and is defined as $$^{r-1}{}_y x = \begin{cases} r-1, & \text{if } x \leq y \\ 0, & \text{else} \end{cases}.$$

The Interference Function to express Lower Threshold operation is:

$$^{r-1}{}_y \tilde{X} = I[(r-1)I_1^k(\tilde{X}, -\tilde{Y}, \tilde{L}_{r/2})].$$

Figure 8B:
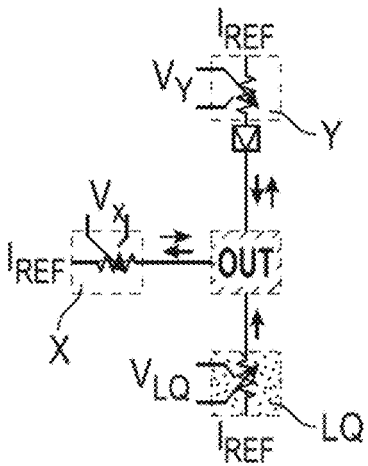

FIG. 8B shows an exemplary physical implementation of a truncated difference operator configured with multi-value unit cells and its truth table. The operator of FIG. 8B is configured with the two-input multi-value cells (X, Y), the intermediate multi-value cell (L0), and the output multi-value cell to realize multi-valued truncated difference functions. The truncated difference operator of FIG. 8B is used to select the difference between two inputs when a condition is satisfied. The notation is xΞy, and the operation is defined as:

$$x \equiv y = \begin{cases} x - y, & \text{when } x > y \\ 0, & \text{else} \end{cases},$$

$$x, y \in \{0, 1, \ldots, r-1\}.$$

This can be expressed with Interference Function as $$\tilde{X} \Xi \tilde{Y} = I(\tilde{X}, -\tilde{Y}, \tilde{L}_0),$$

The difference operation is performed at the junction of incoming signals. In order to achieve the correct output, the resultant signal's amplitude after interference needs to be truncated to 3A, if it is greater than 3A. This truncation can be achieved by configuring multi-state devices, or by designing the spin wave bus and ME cells to accommodate this requirement or through external electrical circuits.

Figure 8C:
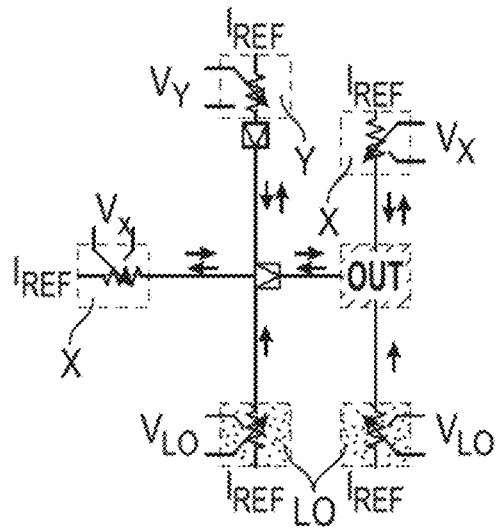

FIG. 8C shows an exemplary physical configuration of a minimum operator configured with multi-value unit cells and its truth table. The operatior of FIG. 8C is configured with three input multi-value cells (X, X, Y), two intermediate multi-value cells (L0, L0) and the output multi-value cell. The Min operator (x·y) in multi-valued logic is analogous to the Boolean AND operator. It is defined as follows:

$$x \cdot y = \begin{cases} x, & x < y \\ x - (x - y), & \text{else} \end{cases}$$

$$x, y \in \{0, 1, \ldots, r-1\}.$$

The functional representation in terms of Interference Function is:

$$\text{Min}(\tilde{X}, \tilde{Y}) = \tilde{X} \Xi (\tilde{X} \Xi \tilde{Y}) = I[\tilde{X}, -(\tilde{X} \Xi \tilde{Y}), \tilde{L}_0]$$

The same assumption for truncation and amplification applies for Min operator implementations. The Max operator is complement of Min operator, and is analogous to Boolean OR.

$$x + y = \begin{cases} x, & x > y \\ x + (x - y), & \text{else} \end{cases}.$$

$$x, y \in \{0, 1, \ldots, r-1\}.$$

The functional representation in terms of Interference Function is $$\text{Max}(\tilde{X}, \tilde{Y}) = \tilde{X} + (\tilde{Y} \Xi \tilde{X}) = I[\tilde{X}, (\tilde{Y} \Xi \tilde{X}), \tilde{L}_{r-1}],$$

where $\tilde{L}_{r-1}$ is a reference wave corresponding to logic value r−1.

The cyclic operator can be also configured with multi-value cells. This is analogous to Boolean XOR, and is defined as $$x \oplus y = (x +_{add} y) \mod r;$$

$$x, y \in \{0, 1, \ldots, r-1\}.$$

Here, '+add' represents arithmetic addition of logic inputs. To implement this function, we define a new operator called Carry operator (denoted by '+carry'):

$$x +_{carry} y = \begin{cases} 1, & \text{if } x +_{add} y > r - 1 \\ 0, & \text{else} \end{cases}$$

$$x, y \in \{0, 1, \ldots, r-1\}.$$

The Carry operator is implemented using Min operator as follows:

$$\tilde{X} +_{carry} \tilde{Y} = \text{Min}[I(\tilde{X}, \tilde{Y}, \tilde{L}_0), \tilde{L}_1].$$

The output of $I(\tilde{X}, \tilde{Y}, \tilde{L}_0)$ represents (x+add y)−r−1, if x+add y>r−1; and 0 otherwise. Therefore, a non-zero output is obtained only when $x +_{add} y > r-1$. The Min operation of this output with $\tilde{L}_1$ provides the binary Carry output. The Cyclic operator is then implemented as:

$$\tilde{X} \oplus \tilde{Y} = I[\tilde{A}, \tilde{B}, \tilde{L}_0, {}^{r-1}{}_r(\tilde{X} +_{add} \tilde{Y}), -(\tilde{X} +_{carry} \tilde{Y})].$$

Figure 8D:
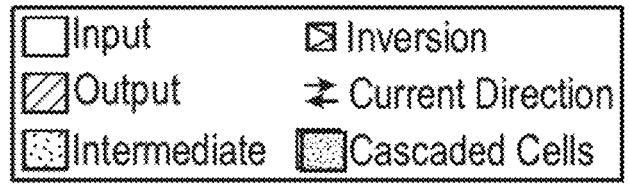
Figure 8D:
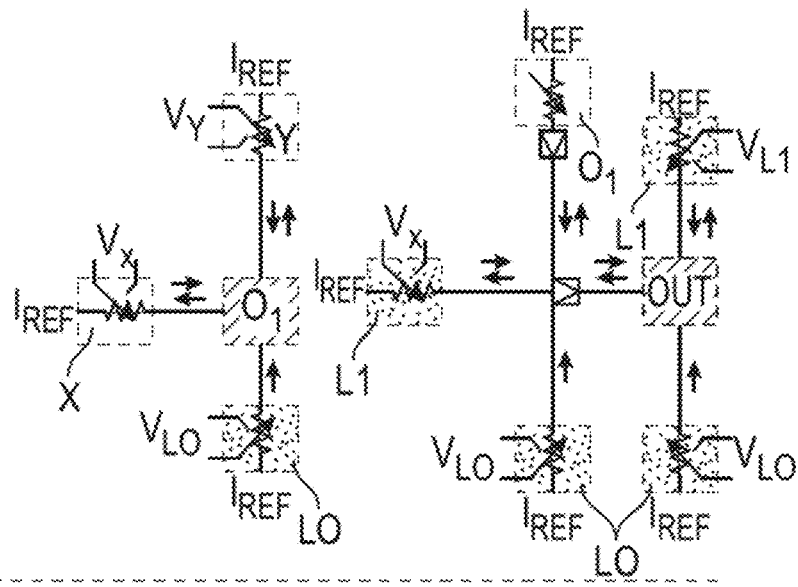
Figure 8E:
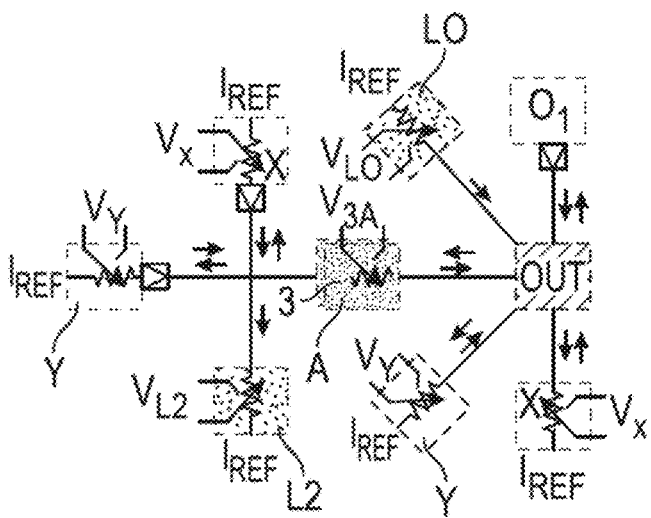

Here, ${}^{r-1}{}_r(\tilde{X} +_{add} \tilde{Y})$ implements the Lower Threshold operation, whose output is r−1 if x+add y ddr−1, and 0 otherwise. FIG. 8D shows an exemplary physical implementation configurations of a carry operator and its truth table. FIG. 8E shows an exemplary physical implementation configuration of a mod-sum operator and its truth table. In FIGS. 8D and 8E, the intermediate multi-value cells (L0, L1, L2) generate waves corresponding to logic 0, 1, and 2, respectively. The operators shown in FIGS. 8A to 8E are only exemplary configurations of possible operators configured with multi-valued multiferroic device. The operators of FIGS. 8A to 8E can be structured in different manners from those shown in FIGS. 8A to 8E and other operators realizing different logic functions can also be configured using multi-valued multiferroic device.

The native or intrinsic 4-state magnetic structure shown in FIG. 1 for building the logic circuits in FIGS. 8A-8E and other devices and systems is one examples of various native or intrinsic 4-state magnetic structures. Such native or intrinsic 4-state magnetic structures include a ferroelectric material layer that exhibits a piezoelectric effect and is operable to produce a strain in response to an electrical control signal applied to the ferroelectric material layer, a ferromagnetic material layer stacked with the ferroelectric material layer in a way to expose the ferromagnetic material to the strain produced by the ferroelectric material layer, and a spin Hall metal layer stacked with the ferroelectric material layer and the ferromagnetic material layer. The ferromagnetic material layer exhibits a biaxial magnetic anisotropy along two different magnetization axes that are stabilized by the strain from the ferroelectric material layer so that the ferromagnetic layer exhibits four different magnetization states based on two different magnetization directions in each of the two different magnetization axes. The spin Hall metal layer is configured to exhibit (1) a spin Hall effect in response to a charge current flowing in the spin Hall metal layer to produce a spin polarized current to flow into the ferromagnetic material layer along a direction perpendicular to the ferromagnetic material layer, and (2) an inverse spin Hall effect in response to a sensing current flowing through the ferromagnetic material layer and the spin Hall metal layer along a sensing current direction perpendicular to the ferromagnetic material layer and the spin Hall metal layer to produce a readout current along the spin Hall metal layer representing one of the four different magnetization states of the ferroelectric material layer. In applications, the native or intrinsic 4-state magnetic structure can be coupled to other control circuits to form a 4-state circuit, e.g., (1) a ferroelectric driver circuit that produces the electrical control signal applied to the ferroelectric material layer, (2) a charge current source circuit coupled to the spin Hall metal layer to generate the charge current flowing in the spin Hall metal layer, and (3) a sensing current source circuit coupled to produce the sensing current flowing through the ferromagnetic material layer to produce the readout current along the spin Hall metal layer.

Figure 9:
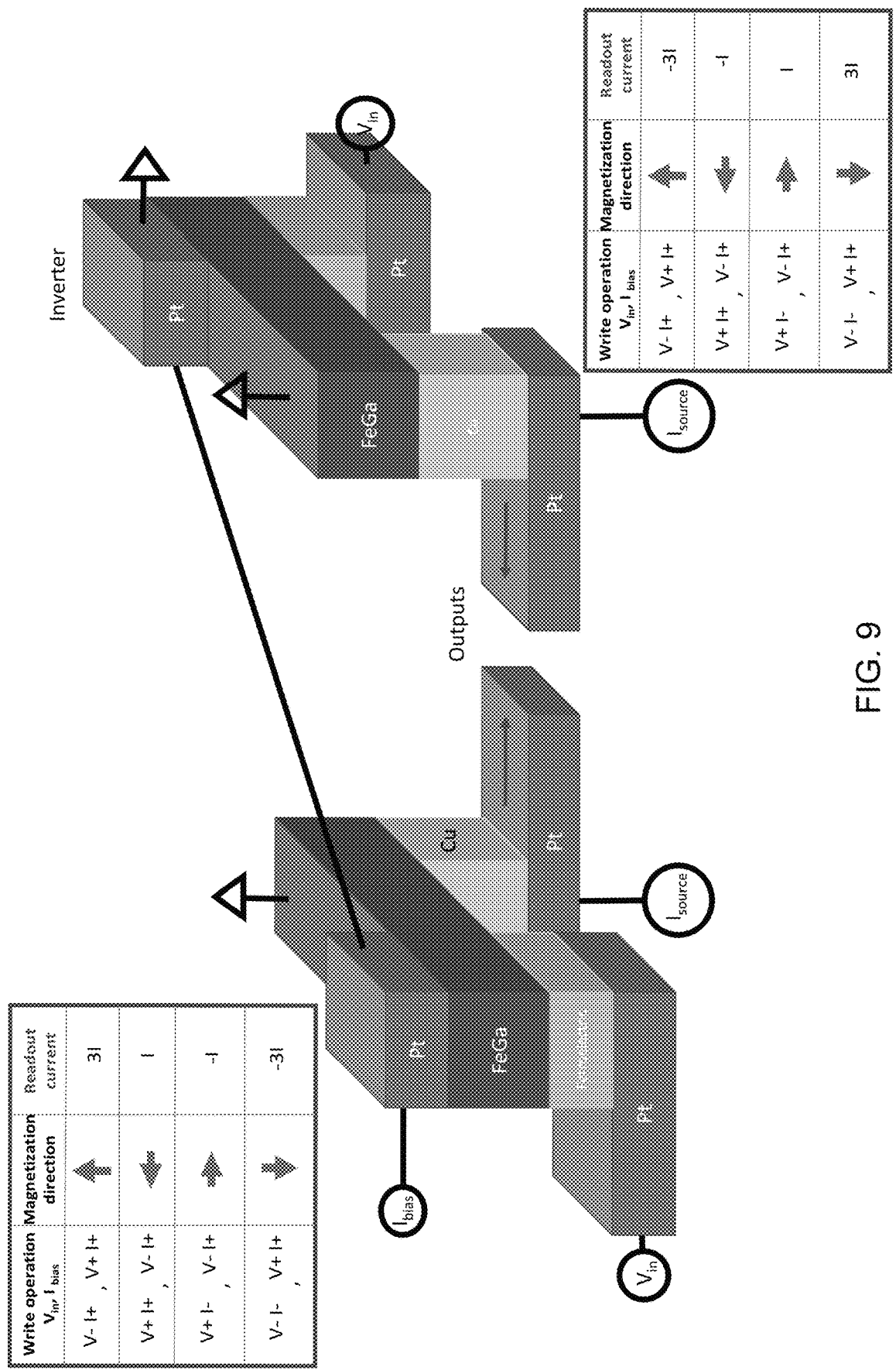
FIGS. 9 to 13 illustrate examples of simplified 3D diagrams and cross-sectional views of intrinsic 4-state magnetic structures and their corresponding inverter structures.
Figure 10:
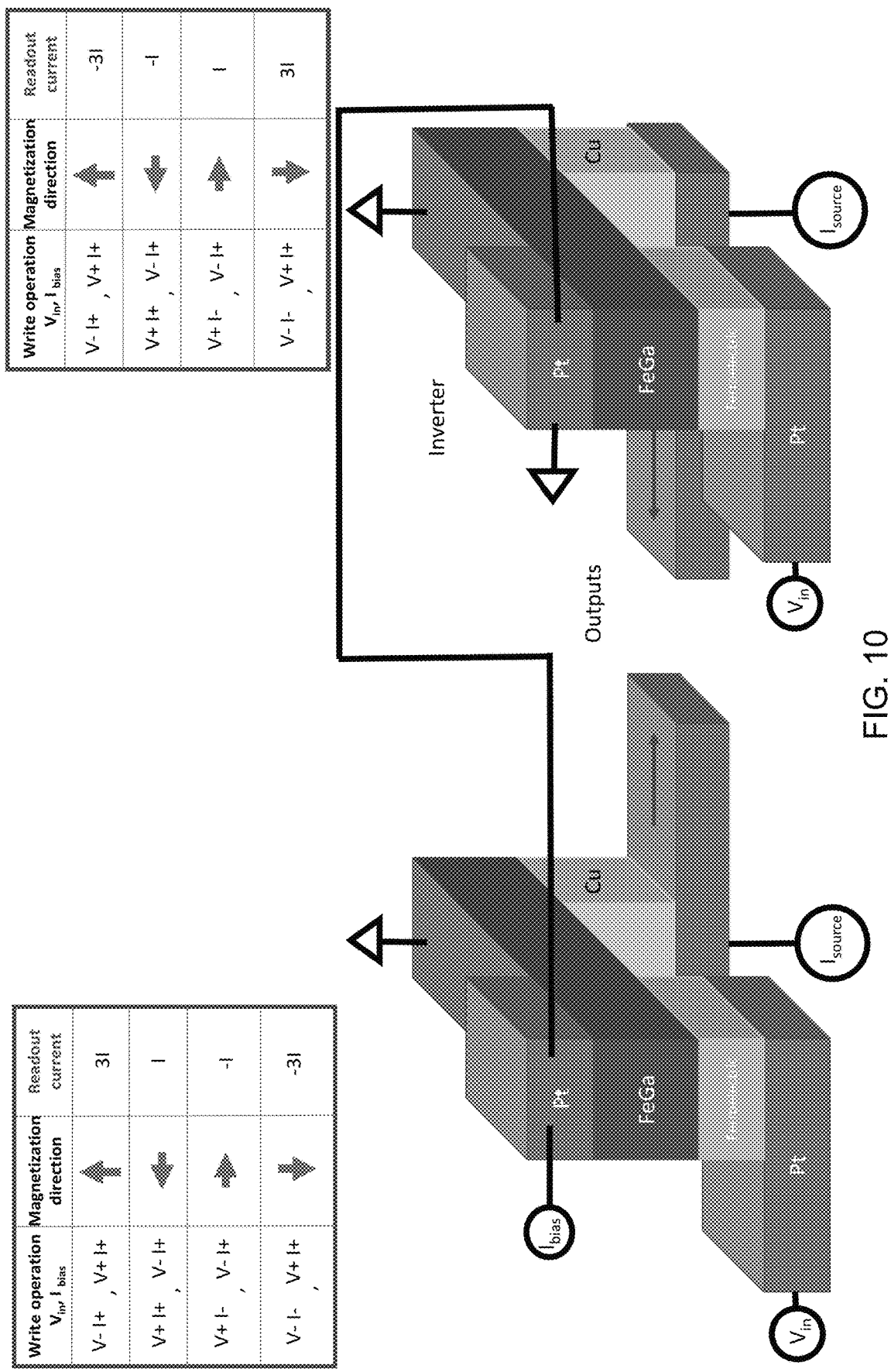
Figure 11:
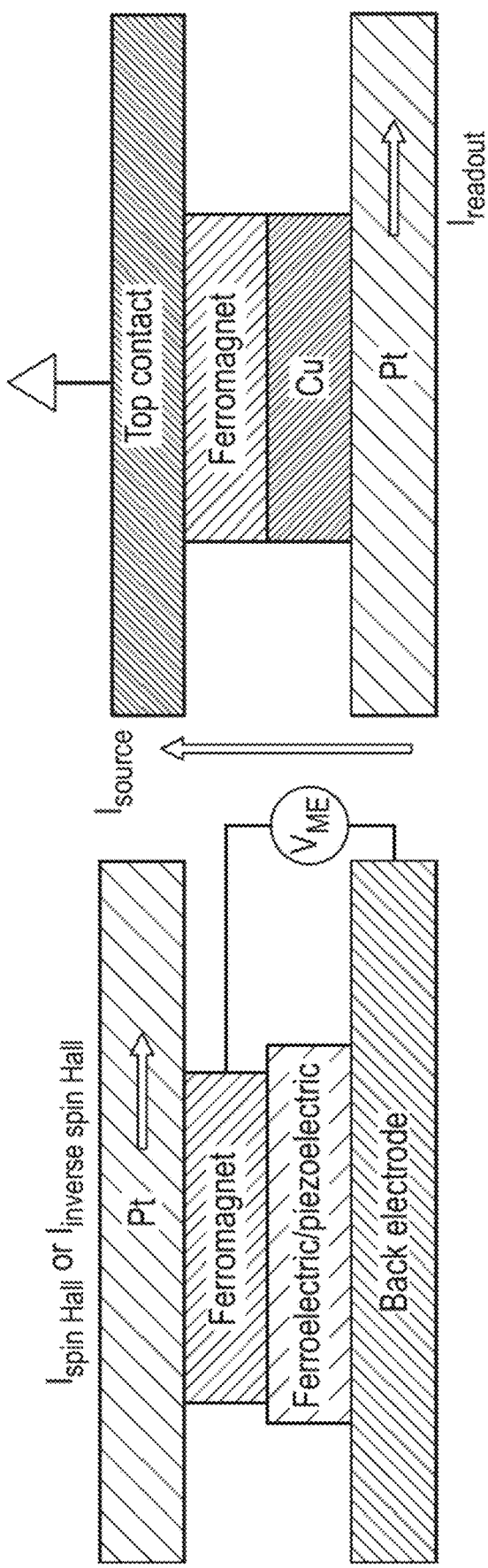
Figure 12:
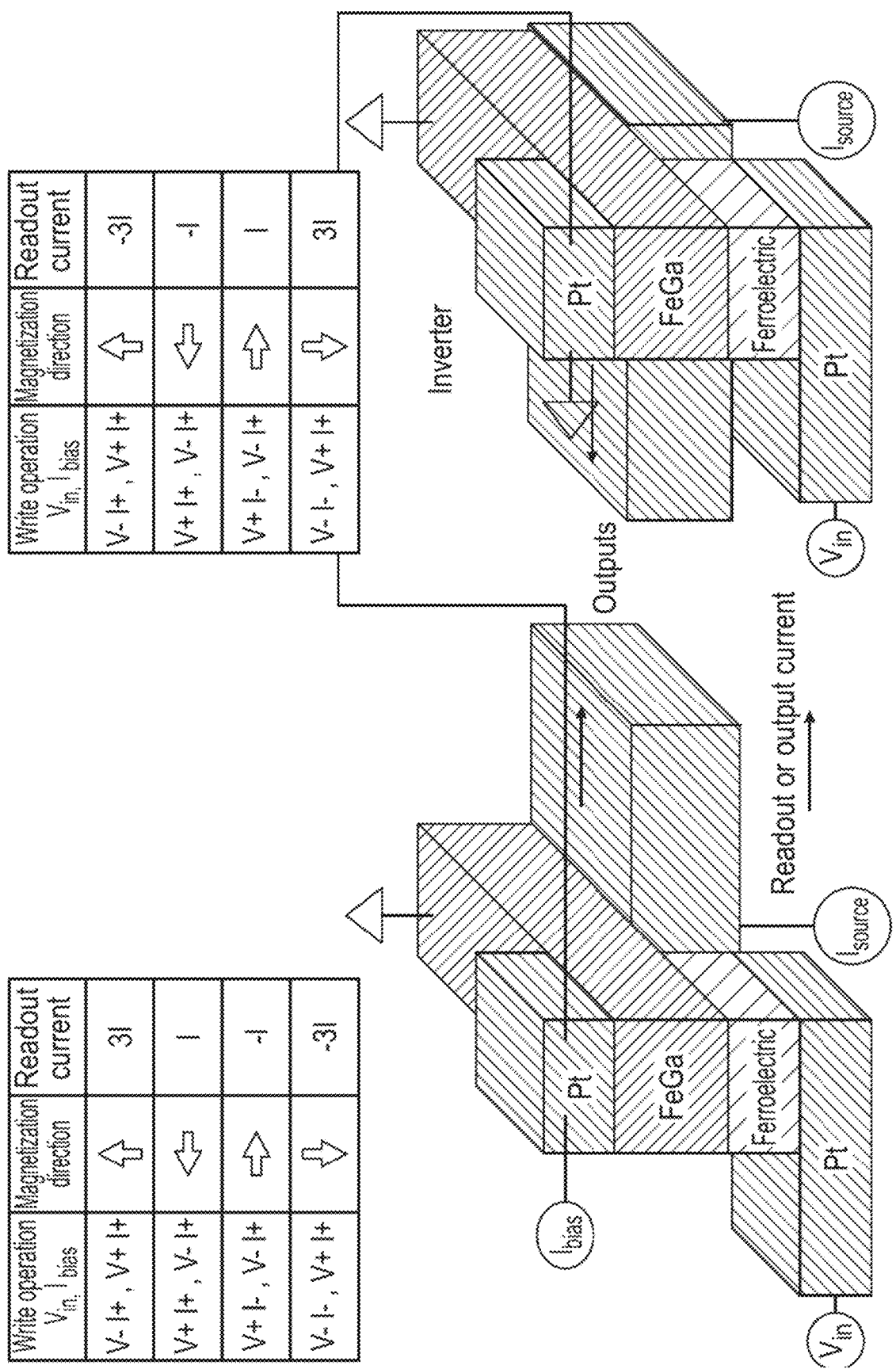
Figure 13:
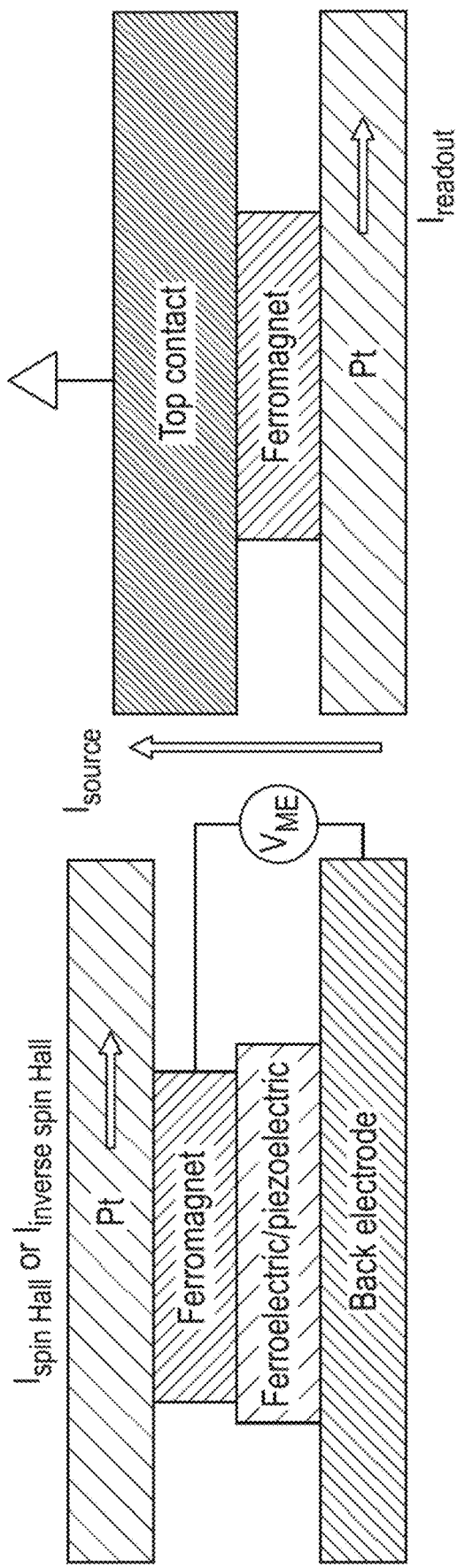

FIGS. 9 to 13 illustrate additional examples of intrinsic 4-state magnetic structures. FIGS. 9, 10 and 12 are 3D diagrams of exemplary 4-state magnetic structures. FIG. 11 is a cross-sectional view of FIGS. 9 and 10 and FIG. 13 is a cross-sectional view of FIG. 12. In the examples of FIGS. 9 to 13, the 4-state magnetic structures have different arrangement of layers from that of FIG. 1, for example, the location of the spin Hall metal layer. The examples of FIGS. 9 to 13 include a 4-state magnetic structure on the left side and a corresponding inverter structure on the right side. Each of the 4-state magnetic structure and the corresponding inverter structure includes a multi-valued multiferroic structure having a bottom contact layer (e.g., Pt), a ferroelectric layer, a ferromagnetic layer (e.g., FeGa), and a top contact layer (e.g., Pt). In the exemplary designs of FIGS. 9 to 13, the Pt layer is arranged on both top and bottom of each multi-valued unit. At the bottom, the Pt layer is configured as two separate electrodes, one of which $V_{in}$ is applied to provide a strain to the ferroelectric layer and the other of which the inverse spin Hall current, i.e., $I_{readout}$, flows. At the top, $I_{bias}$ is applied to the Pt layer to cause a spin Hall effect. In the example of FIGS. 9 and 10, the Cu layer is included between the Pt layer at the bottom and the FeGa layer. In the example of FIG. 12, the Cu layer is omitted.

In the examples of FIGS. 9 to 13, $V_{in}$ is the voltage applied to generate a stress in the piezoelectric layer. This causes a rotating of the easy axis in the piezomagnetic material through strain-induced anisotropy, with two preferred directions (along or opposite to the new easy axis). The angle of rotation of the easy axis is determined by the strength of the applied electric field, $I_{bias}$. Thus, the voltage applied $V_{in}$ results in a change in the magnetic polarization of the ferromagnetic material, and vice versa. The source current $I_{source}$ flows vertically through the stack structure and produces the readout current. The truth tables corresponding to the respective multi-valued multiferroic structures are provided adjacent to the multi-valued stack structures.

Various logic applications with the multi-valued multiferroic configuration have been discussed. The multi-valued multiferroic configuration is also capable of storing data. Referring back to FIG. 2, the multi-value unit cell 200 includes a memory control circuit that controls the readout control circuit CK3 230, in a readout operation, to produce the sourcing current flowing through the ferromagnetic material layer to produce the readout current along the spin Hall metal layer that indicates which one of the four different magnetization states that the ferromagnetic material layer is in for a stored data bit. The memory control circuit is coupled to CK1 for the piezoelectric effect and CK2 for the spin-Hall effect, in a writing operation, to control the charge current in the spin Hall metal layer and the electrical control signal applied to the ferroelectric material layer in setting a magnetization direction of the ferromagnetic material layer to be in a selected magnetization state of the four different magnetization states of the ferromagnetic material layer to store a data bit represented by the selected magnetization state.

Figure 14:
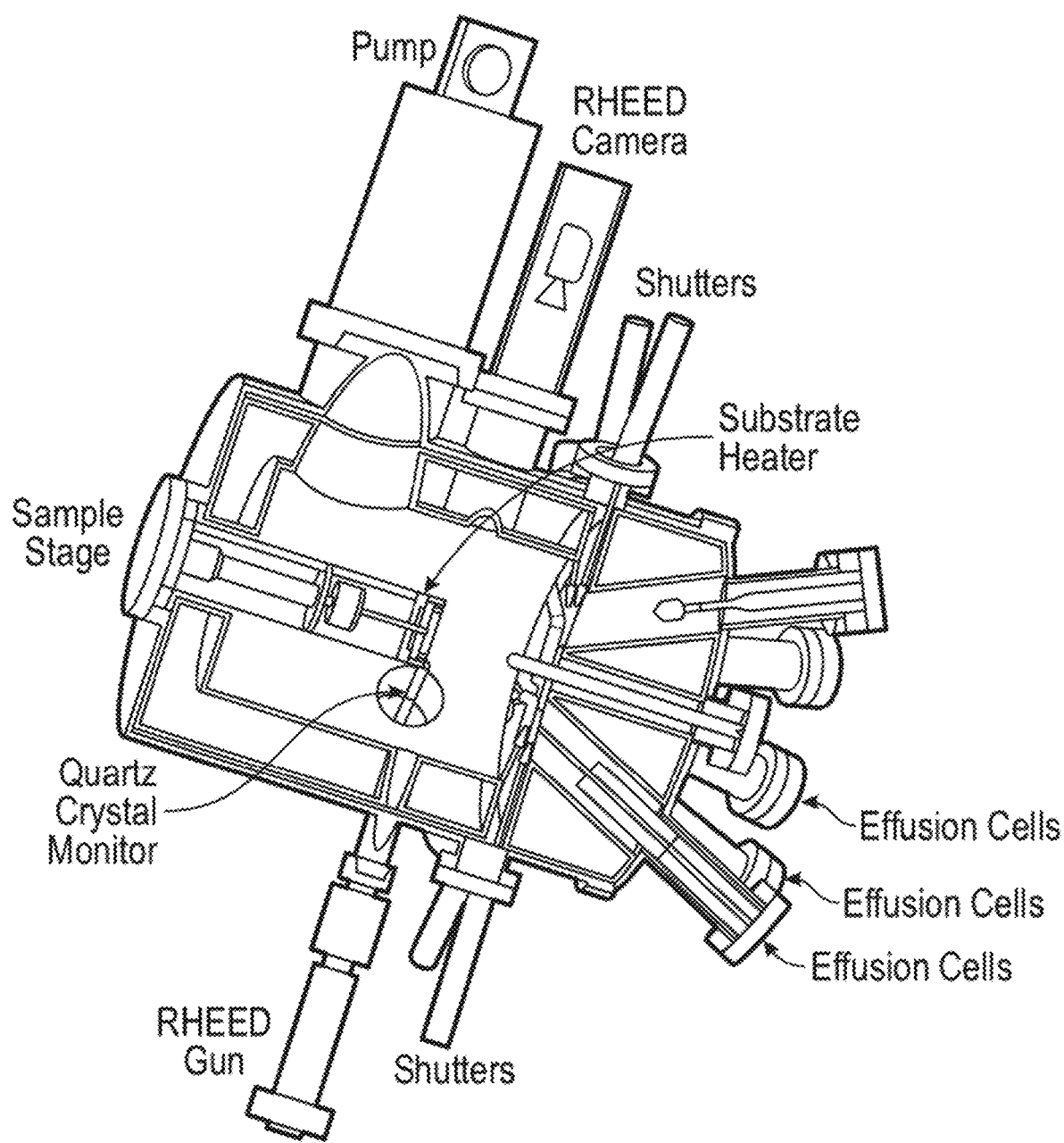
FIG. 14 shows an exemplary equipment for providing a multi-valued multiferroic device.

FIGS. 14 to 18 illustrate an exemplary equipment for providing a multi-valued multiferroic device and various simulation diagrams and data on the multi-valued multiferroic device. To provide the suggested multi-valued multiferroic device, a UHV deposition chamber is utilized, which is equipped with a heater to heat substrates to the desired growth temperatures. Examples of suitable deposition techniques meeting these requirements are, among others, Molecular Beam Epitaxy (MBE), Sputtering and Pulsed Laser deposition (PLD). As an example, FIG. 14 shows an MBE technique to demonstrate the deposition of the layers of the multi-valued multiferroic structure. The layers of the multi-valued multiferroic device can be deposited in many other, for example, less sophisticated, vacuum deposition systems as well. Post deposition of the layers can be achieved in various ways. For example, the deposited layers can be defined into the device architecture and involves using cleanroom fabrication techniques.

FIGS. 15 to 18 show various representations that are obtained as results of simulations, tests, or calculations to demonstrate properties and characteristics of the multi-valued multiferroic device.

Figure 15:
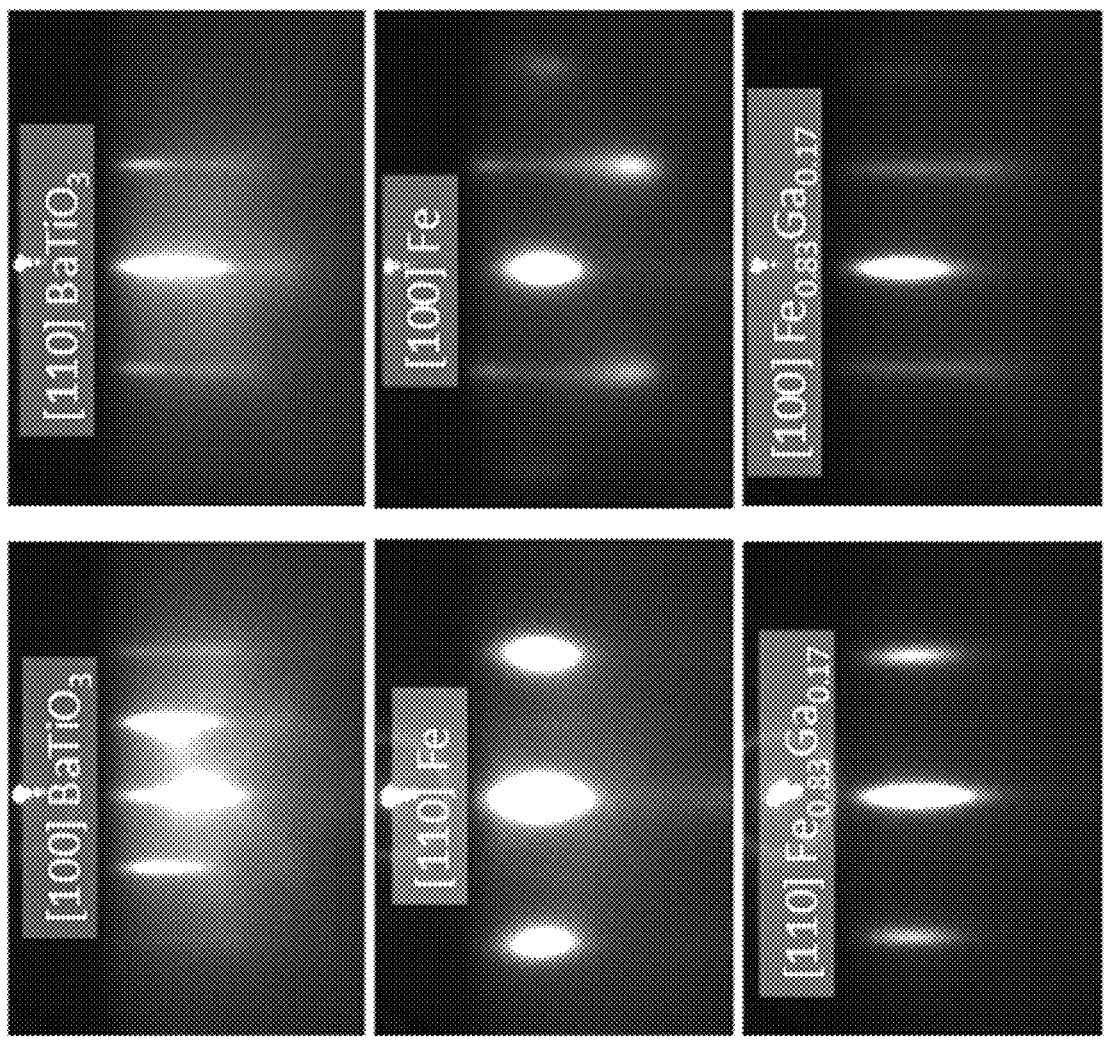
FIG. 15 shows reflection high-energy electron diffraction (RHEED) images which demonstrate depositions of layers in a multi-valued multiferroic device.

FIG. 15 shows reflection high-energy electron diffraction (RHEED) images which demonstrate the successful deposition of some of the layers used in the multi-valued multiferroic device. The RHEED images in FIG. 15 are taken at the end of the growth of each layer in the 6 nm Fe0.83Ga0.17/<1 nm Fe/50 nm BaTiO3/GdScO3 substrate stack. The azimuths are indicated in the images. The images reveal that each layer is deposited epitaxially and is single crystalline.

Figure 16:
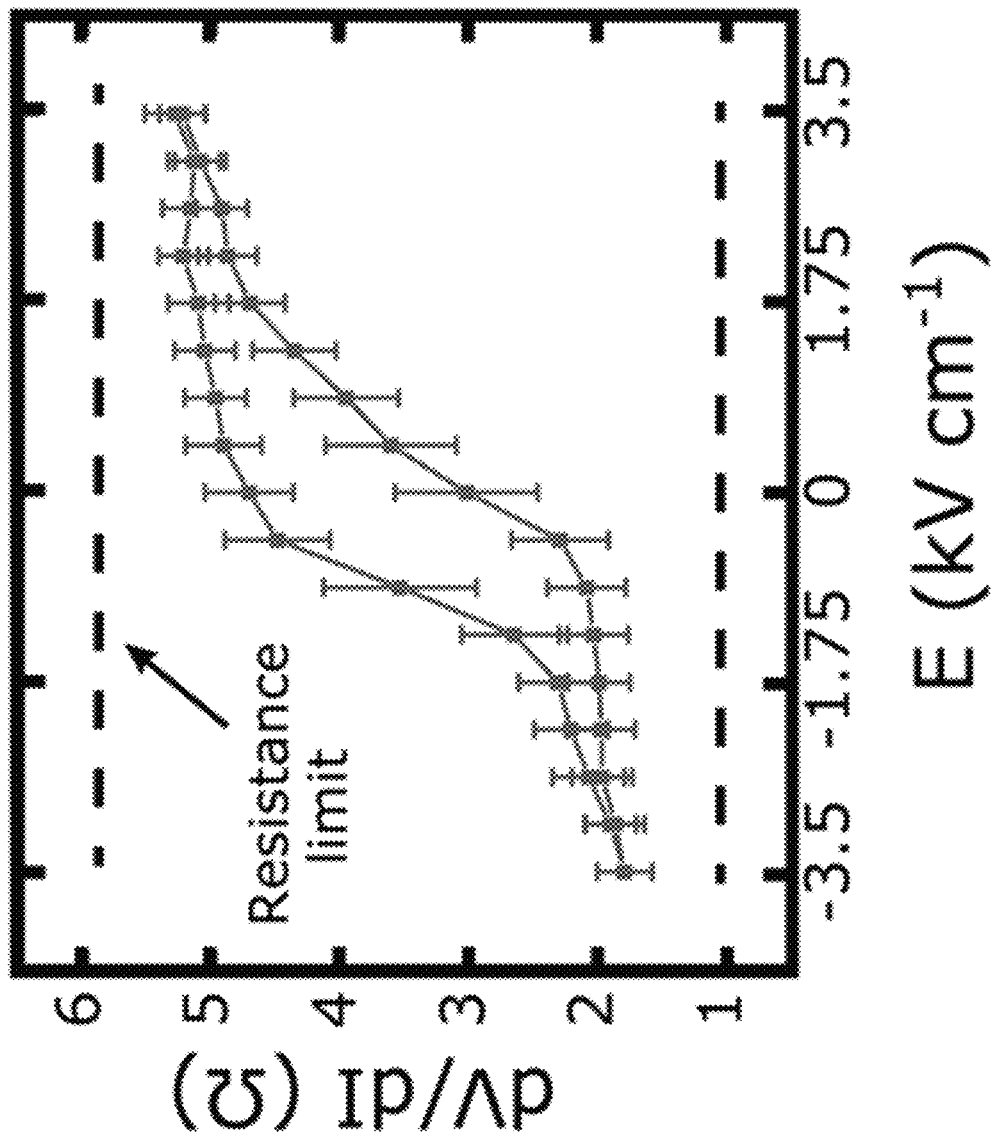
FIG. 16 shows measured anisotropic magnetoresistance data due to an applied voltage to the ferroelectric material layer driving the piezo-strain to move the magnetization of the ferromagnetic material layer.

FIG. 16 shows measured anisotropic magnetoresistance data due to an applied voltage to the ferroelectric material layer driving the piezo-strain to move the magnetization of the ferromagnetic material layer.

FIG. 17A to 17C show various data on characteristics of the multi-valued multiferroic device. For example, FIG. 17A shows measured anisotropic magnetoresistance loop (left axis-red curve) versus electric field at B=0 and ferroelectric polarization (right axis-blue curve) versus electric field for our composite multiferroic structure (FeGa/PMN-PT). FIG. 17B shows a cross sectional TEM image of FeGa on PMN-PT looking down the [001] PMN-PT zone axis. FIG. 17C shows a map of the element signatures across the thickness of the heterostructures obtained by EDX. Ti is a capping layer. Scale bars are 60 nm.

Figure 18:
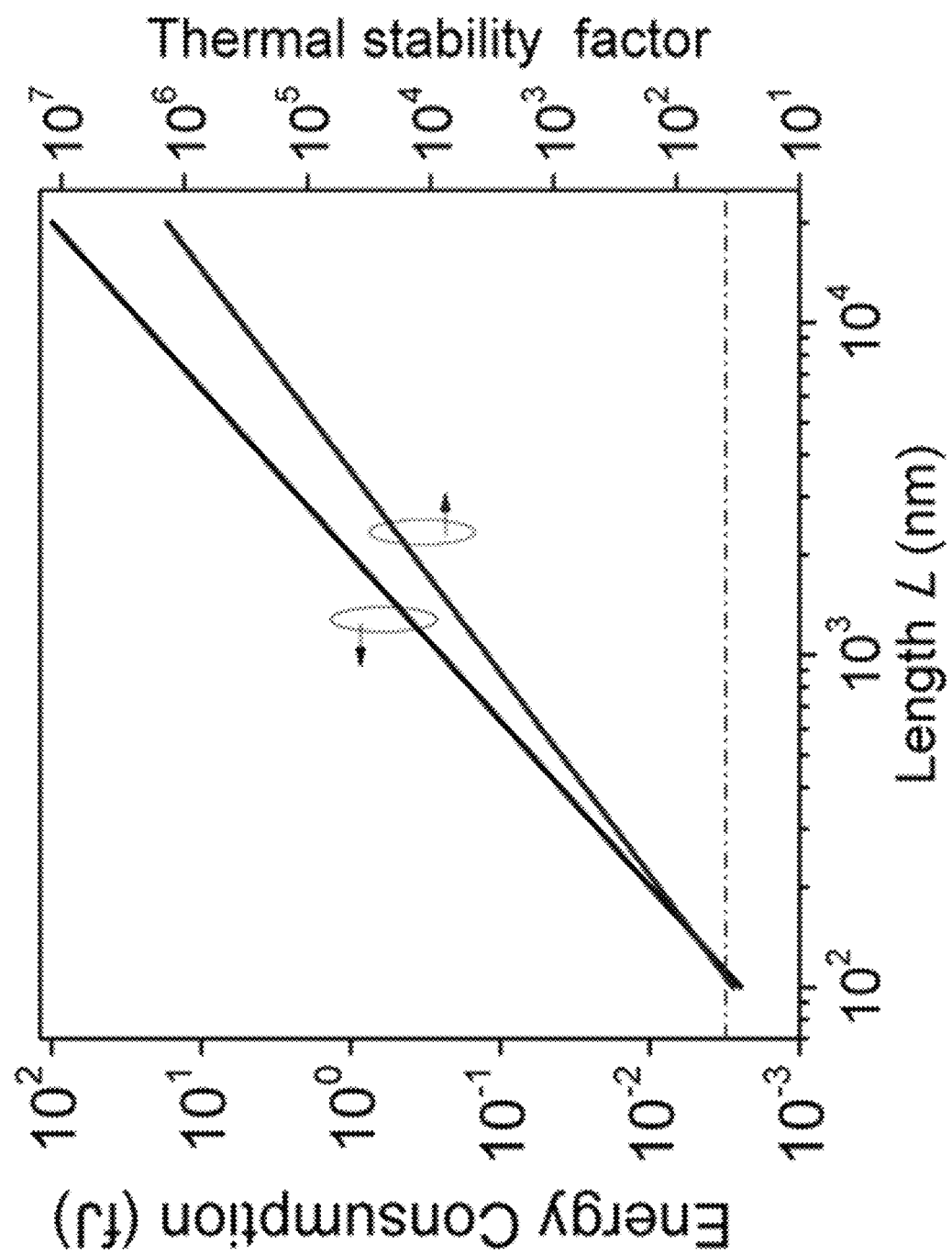
FIG. 18 shows calculation of an energy dissipation of a magnetoelectric switching in a multi-valued multiferroic device

FIG. 18 shows calculation of the energy dissipation of the magnetoelectric switching in the multi-valued multiferroic device as it is scaled to device dimensions. The calculation estimates that the dissipation is ~3 aJ at device dimensions of 44×110×75 nm3, while still preserving thermal stability. This illustrates the low energy consumption of the device at scale.

Figure 7:
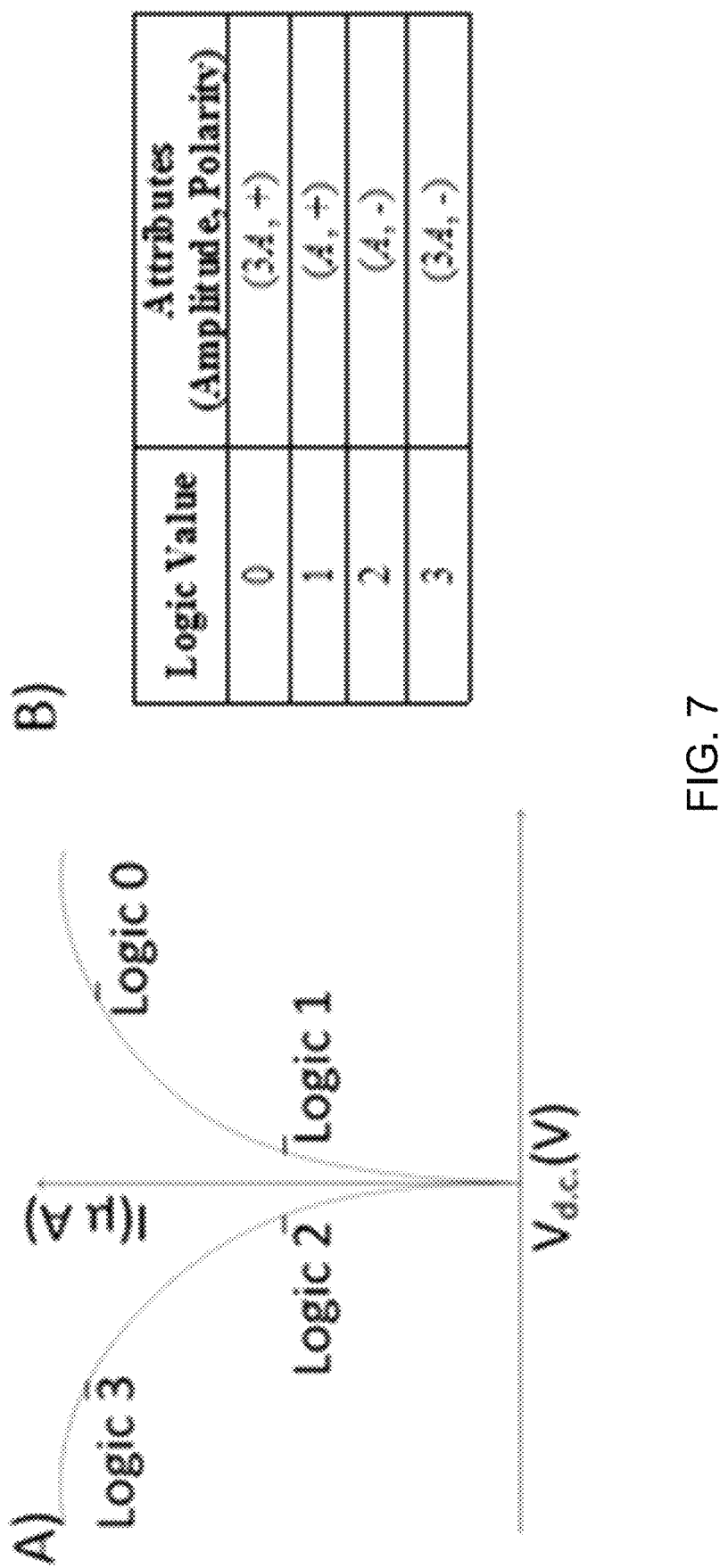
FIGS. 7A and 7B show an exemplary illustration of quaternary data encoding for a multi-valued multiferroic device.
Figure 19:
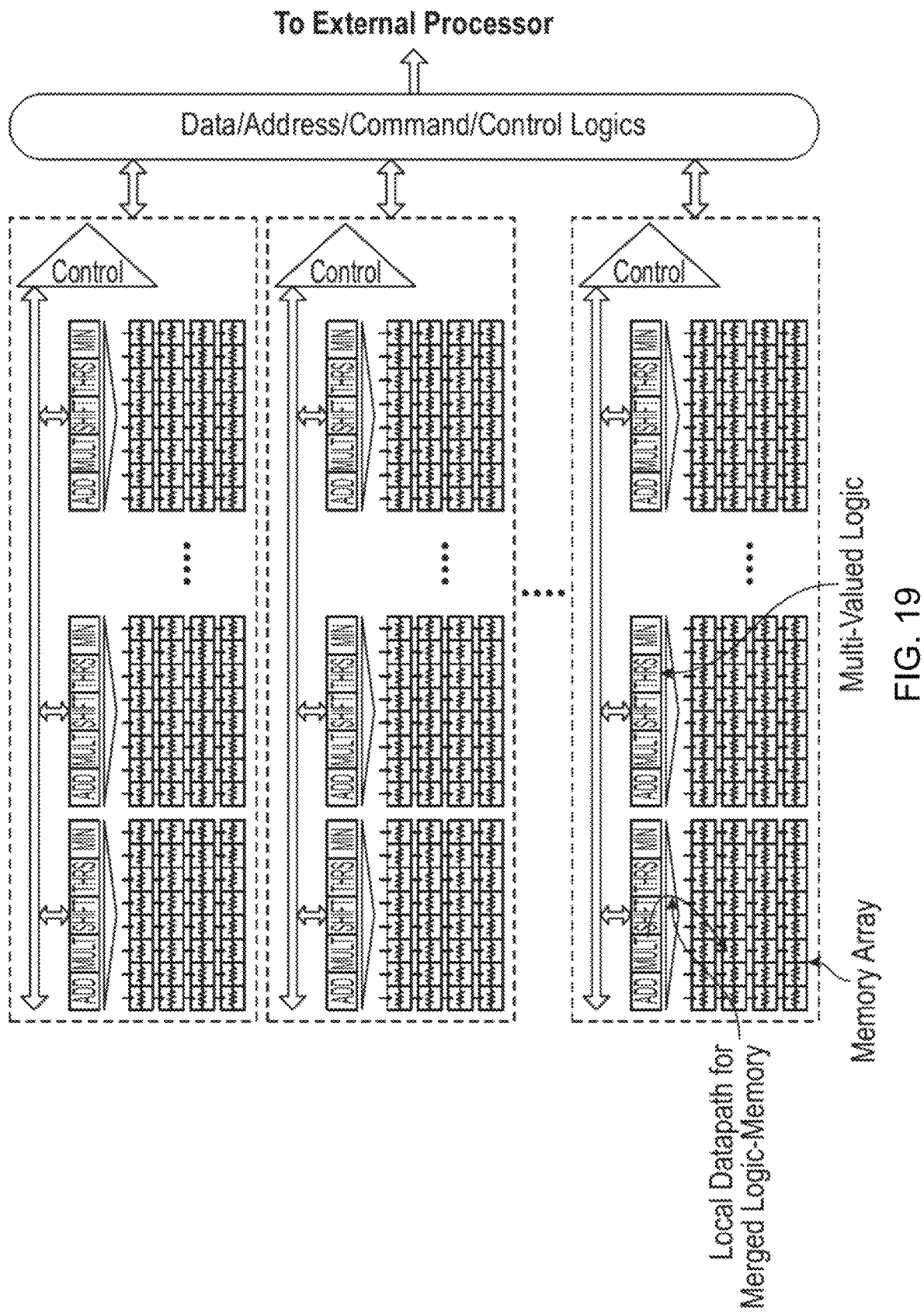
FIG. 19 shows an exemplary big data application showing memory arrays with multi-valued multiferroic device.

FIG. 19 shows an exemplary big data application showing memory arrays with multi-valued multiferroic device for pattern storage, search, and etc. A merged logic-memory fabric using non-volatile multi-valued magnetic structures are proposed, which can (i) merge computation with memory leading to a distributed architecture with a lesser degree of localization for execution and memory units, reducing computation and communication requirements; and (ii) potentially surmount the memory-wall problem that impacts CMOS processors. The proposed devices exhibit intrinsic non-volatile multi-state characteristics. In this fabric, we utilize the stable states at different resistances to encode multiple logic levels (FIG. 7). Computation is through summation of read-out currents. To meet IF's implementation requirements, these devices can be customized and cascaded to achieve signal amplification and/or truncation. The same device can be used to achieve signal inversion. FIGS. 8A to 13 show implementation of core multi-valued logical constructs using this fabric.

Application drivers will include complex processing and data intensive applications. New capabilities such as merged logic-memory computing can address large data storage fused with parallel instantaneous search: e.g., it could enable a unique parallel platform for Internet information access. Obtaining match and relative information of stored data, and their manipulation are key for any big-data architecture. The proposed multi-valued device and logical constructs in the merged logic-memory fabric will allow necessary parallel instanteneous search, comparisons, and inference operations. The idea is illustrated in FIG. 19; a large memory is segmented in small blocks with each block having individual computational units. While storing information, the computational units will allow localized processing, and fascilitate storage of incoming data along with results of logical implications and arithmetic operation with respect to previously stored data. During the data retrieval process, the distributed units along with pre-formatted storage will allow efficient data search and match.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is what is described or illustrated, including:

1. A semiconductor device, comprising:
   a multi-layer structure including a ferromagnetic, magnetostrictive layer that exhibits a biaxial magnetic anisotropy and an underlying structure that exhibits a spin Hall effect to provide a conversion between electrical energy and magnetic energy with more than two distinctive magnetic states, the underlying structure including:
   (i) a piezoelectric material structure to exert a stress to the ferromagnetic, magnetostrictive layer to cause different magnetization directions in the ferromagnetic, magnetostrictive layer to be distinctive from one another and to represent the more than two distinctive magnetic states; and
   (ii) a spin Hall metal layer that exhibits the spin Hall effect to inject a spin polarized current into the ferromagnetic, magnetostrictive layer to cause the ferromagnetic, magnetostrictive layer to be in one of the different magnetization directions in the ferromagnetic, magnetostrictive layer.

2. The device as in claim 1, wherein:
   the multi-layer structure includes a multiferroic structure comprising a piezoelectric material structure disposed below the ferromagnetic, magnetostrictive layer.

3. The device as in claim 2, wherein the multi-layer structure includes Fe and Ga.

4. The device as in claim 3, wherein the multi-layer structure includes $Fe_{1-x}Ga_x$, on $BaTiO_3$.

5. The device as in claim 1, further comprising a device circuitry coupled to the piezoelectric material structure to apply a piezoelectric control signal in controlling the exerted stress and to apply a charge current in the spin Hall metal layer to set the ferromagnetic, magnetostrictive layer in a specific magnetic state of the more than two distinctive magnetic states, wherein the device circuitry is further operable to supply a sensing current flowing through the ferromagnetic, magnetostrictive layer to produce a readout current along the spin Hall metal layer that indicates the specific magnetic state of the more than two distinctive magnetic states.

6. A semiconductor device, comprising:
   a multi-state circuit that exhibits four different magnetic states and includes a multi-layer structure that includes:
   a ferroelectric material layer that exhibits a piezoelectric effect and is operable to produce a strain in response to an electrical control signal applied to the ferroelectric material layer;
   a ferromagnetic material layer stacked with the ferroelectric material layer in a way to expose the ferromagnetic material to the strain produced by the ferroelectric material layer, the ferromagnetic material layer exhibiting a biaxial magnetic anisotropy along two different magnetization axes that are stabilized by the strain from the ferroelectric material layer so that the ferromagnetic layer exhibits four different magnetization states based on two different magnetization directions in each of the two different magnetization axes; and
   a spin Hall metal layer stacked with the ferroelectric material layer and the ferromagnetic material layer and configured to exhibit (1) a spin Hall effect in response to a charge current flowing in the spin Hall metal layer to produce a spin polarized current to flow into the ferromagnetic material layer along a direction perpendicular to the ferromagnetic material layer, and (2) an inverse spin Hall effect in response to a sensing current flowing through the ferromagnetic material layer and the spin Hall metal layer along a sensing current direction perpendicular to the ferromagnetic material layer and the spin Hall metal layer to produce a readout current along the spin Hall metal layer representing one of the four different magnetization states of the ferroelectric material layer, and
   wherein the multi-state circuit includes (1) a ferroelectric driver circuit that produces the electrical control signal applied to the ferroelectric material layer, (2) a charge current source circuit coupled to the spin Hall metal layer to generate the charge current flowing in the spin Hall metal layer, and (3) a sensing current source circuit coupled to produce the sensing current flowing through the ferromagnetic material layer to produce the readout current along the spin Hall metal layer.

7. The device as in claim 6, wherein the spin Hall metal layer is between the ferroelectric material layer and the ferromagnetic material layer.

8. The device as in claim 6, wherein the ferroelectric material layer and the ferromagnetic material layer are placed next to each other.

9. The device as in claim 8, wherein the spin Hall metal layer is next to the ferromagnetic material layer.

10. The device as in claim 6, wherein the ferromagnetic material layer includes Fe and Ga.

11. The device as in claim 6, wherein the ferroelectric material layer includes PMN-PT ($(1-x)PbMg_{1/3}Nb_{2/3}O_3$-$(x)PbTiO_3$).

12. The device as in claim 6, wherein the spin Hall metal layer includes Pt, Ta, W, $Bi_2Se_3$, or an Au—Bi alloy.

13. The device as in claim 6, wherein
the multi-layer structure is structured so that the spin Hall metal layer is formed over the ferroelectric material layer and the ferromagnetic material layer is formed over the spin Hall metal layer, and
the multi-layer structure further includes an electrically conductive layer formed over the ferromagnetic material layer.

14. The device as in claim 6, wherein
the multi-layer structure is structured so that the spin Hall metal layer is formed over the ferromagnetic material layer formed over the ferroelectric material layer.

15. The device as in claim 6, comprising different multi-state circuits that each exhibit four different magnetic states and are coupled to collectively perform logic operations.

16. The device as in claim 6, wherein:
the multi-state circuit is a memory circuit that stores data based on the four different magnetization states of the ferromagnetic layer,
the multi-state circuit includes a memory control circuit that controls the sensing current source circuit, in a readout operation, to produce the sensing current flowing through the ferromagnetic material layer to produce the readout current along the spin Hall metal layer that indicates which one of the four different magnetization states that the ferromagnetic material layer is in for a stored data bit, and
the memory control circuit is coupled to the ferroelectric driver circuit and the charge current source circuit, in a writing operation, to control the charge current in the spin Hall metal layer and the electrical control signal applied to the ferroelectric material layer in setting a magnetization direction of the ferromagnetic material layer to be in a selected magnetization state of the four different magnetization states of the ferromagnetic material layer to store a data bit represented by the selected magnetization state.

17. The device as in claim 6, wherein the two different magnetization axes provides four different magnetization directions that are in-plane or in combination of the in-plane or out-of-plane.

18. The device as in claim 6, wherein the ferroelectric driver circuit and the charge current source circuit collectively operate to switch a magnetization state of the four different magnetization states.

19. The device as in claim 6, wherein the readout current has a selected value of four different values corresponding to the four different magnetization states, the four different values being different combinations of the charge current and the electrical control signal.

* * * * *